(12) United States Patent
Fukuzawa et al.

(10) Patent No.: US 8,049,999 B2
(45) Date of Patent: Nov. 1, 2011

(54) MAGNETORESISTANCE EFFECT ELEMENT WITH A LAYER CONTAINING AN OXIDE AS A PRINCIPAL COMPONENT AND CONTAINING A MAGNETIC TRANSITION METAL ELEMENT WHICH DOES NOT BOND TO OXYGEN

(75) Inventors: Hideaki Fukuzawa, Kawasaki (JP); Katsuhiko Koi, Kawasaki (JP); Hiromi Fuke, Kawasaki (JP); Hiroshi Tomita, Yokohama (JP); Hitoshi Iwasaki, Yokosuka (JP); Masashi Sahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 422 days.

(21) Appl. No.: 12/347,543

(22) Filed: Dec. 31, 2008

(65) Prior Publication Data
US 2009/0109581 A1 Apr. 30, 2009

Related U.S. Application Data

(62) Division of application No. 11/001,174, filed on Dec. 2, 2004, now Pat. No. 7,476,414, which is a division of application No. 09/944,075, filed on Sep. 4, 2001, now Pat. No. 6,853,520.

(30) Foreign Application Priority Data

Sep. 5, 2000 (JP) ................................. 2000-268934
Sep. 5, 2000 (JP) ................................. 2000-269099

(51) Int. Cl.
*G11B 5/39* (2006.01)
(52) U.S. Cl. .................................................. 360/324.1
(58) Field of Classification Search ............... 360/324.1, 360/324.11, 324.12, 324.2; 427/529; 324/252, 324/207.21; 338/32 R, 32 H
See application file for complete search history.

(56) References Cited

U.S. PATENT DOCUMENTS

| 5,206,590 A | * | 4/1993 | Dieny et al. ................... 324/252 |
| 5,287,238 A | * | 2/1994 | Baumgart et al. ............ 360/314 |
| 5,923,504 A | | 7/1999 | Araki et al. |
| 5,949,622 A | | 9/1999 | Kamiguchi et al. |
| 5,962,080 A | | 10/1999 | Tan et al. |

(Continued)

FOREIGN PATENT DOCUMENTS
JP 10-324969 12/1998
(Continued)

OTHER PUBLICATIONS

W.F. Egelhoff, et al., J. Appl. Phys., vol. 82, No. 12, pp. 6142-6151, "Oxygen As a Surfactant in the Growth of Giant Magnetoresistive Spin Valves," Dec. 15, 1997.

(Continued)

*Primary Examiner* — Brian Miller
(74) *Attorney, Agent, or Firm* — Oblon, Spivak, McClelland, Maier & Neustadt, L.L.P.

(57) ABSTRACT

There are provided a magnetoresistance effect element, a magnetic head, a magnetic head assembly and a magnetic recording system, which have high sensitivity and high reliability. The magnetoresistance effect element has two ferromagnetic layers, a non-magnetic layer provided between the ferromagnetic layers, and a layer containing an oxide or nitride as a principal component, wherein the layer containing the oxide or nitride as the principal component contains a magnetic transition metal element which does not bond to oxygen and nitrogen and which is at least one of Co, Fe and Ni.

10 Claims, 20 Drawing Sheets

SENSE CURRENT
⟶

| Free-NOL (1.5) |
| Spin-filter (Cu 1) |
| Free (CoFeNi 2) |
| Spacer (cu 2) |
| Pin (CoFe 2) |
| Pin-NOL (1.5) |
| Pin (CoFe 0.5) |
| Ru 0.9 |
| Pin (CoFe 1.5) |
| Antiferro (PtMn 10) |
| Seed (NiFeCr 3) |
| Buffer (Ta 3) |

U.S. PATENT DOCUMENTS

| | | | |
|---|---|---|---|
| 6,025,979 A * | 2/2000 | Yamane et al. | 360/324.1 |
| 6,088,195 A * | 7/2000 | Kamiguchi et al. | 360/324.12 |
| 6,090,498 A * | 7/2000 | Omata et al. | 428/811.2 |
| 6,111,729 A * | 8/2000 | Kamiguchi et al. | 360/324.1 |
| 6,221,518 B1 * | 4/2001 | Araki et al. | 428/811.2 |
| 6,258,470 B1 * | 7/2001 | Sakakima et al. | 428/811.2 |
| 6,275,363 B1 | 8/2001 | Gill | |
| 6,330,137 B1 | 12/2001 | Knapp et al. | |
| 6,341,052 B2 * | 1/2002 | Hayashi | 360/324.1 |
| 6,353,318 B1 | 3/2002 | Sin et al. | |
| 6,452,763 B1 | 9/2002 | Gill | |
| 6,495,275 B2 * | 12/2002 | Kamiguchi et al. | 360/324.11 |
| 6,519,123 B1 | 2/2003 | Sugawara et al. | |
| 6,556,390 B1 | 4/2003 | Mao et al. | |
| 6,567,246 B1 | 5/2003 | Sakakima et al. | |
| 7,008,702 B2 * | 3/2006 | Fukuzawa et al. | 428/811.2 |
| 2002/0159201 A1 | 10/2002 | Li et al. | |
| 2003/0026049 A1 | 2/2003 | Gill | |

FOREIGN PATENT DOCUMENTS

| | | |
|---|---|---|
| JP | 2000-137906 | 5/2000 |
| JP | 2000-156530 | 6/2000 |
| JP | 2001-358380 | 12/2001 |

OTHER PUBLICATIONS

Y. Kamiguchi, et al., The 1999 IEEE International Magnetics Conference, "CoFe Specular Spin Valves With a Nano Oxide Layer," May 18-21, 1999.

* cited by examiner

MAGNETORESISTANCE EFFECT ELEMENT WITH A LAYER CONTAINING AN OXIDE AS A PRINCIPAL COMPONENT AND CONTAINING A MAGNETIC TRANSITION METAL ELEMENT WHICH DOES NOT BOND TO OXYGEN

CROSS REFERENCE TO RELATED APPLICATION

This application is a divisional of, and claims the benefit of priority under 35 U.S.C. §120 from, U.S. Ser. No. 11/001,174, filed Dec. 2, 2004, the entire contents of which are incorporated herein by reference. U.S. Ser. No. 11/001,174 is in turn based upon, and claims the benefit of priority under 35 U.S.C. §120 from, U.S. Ser. No. 09/944,075 (now U.S. Pat. No. 6,853,520), filed on Sep. 4, 2001. U.S. Ser. No. 09/944,075 is in turn based upon and claims benefit of priority under 35 U.S.C. §119 from the prior Japanese Patent Applications No. 2000-268934, filed on Sep. 5, 2000; and No. 2000-269099, filed on Sep. 5, 2000; the entire contents of each of which are incorporated herein by reference.

BACKGROUND OF THE INVENTION

1. Field of the Invention

The present invention relates generally to a magnetoresistance effect element, a method and system for fabricating the same, and a magnetic reading system using the same. More specifically, the invention relates to a magnetoresistance effect element using a spin-valve film having an oxide layer or a nitride layer as a magnetoresistance effect improving layer for causing a specular reflection of electrons, a method and system for fabricating the same, and a magnetic reading system using the same.

2. Description of Related Art

In order to realize the enhancement of the density of hard disk drives (HDDs), a giant magnetoresistance effect (GMR) head using the magnetoresistance effect has been developed. In order to further enhance the density, a spin-valve giant magnetoresistive (SV-GMR) head is required, and it is important to further improve a rate of change in magnetoresistance (which will be hereinafter referred to as a "rate of change in MR"). The SV-GMR head means a magnetic head utilizing the giant magnetoresistance effect (GMR) based on a spin-valve (SV) film. The SV means one capable of obtaining a giant magnetoresistance by sandwiching a non-magnetic layer (which is called a "spacer layer" or a "non-magnetic intermediate layer") between two metal ferromagnetic layers, fixing one (which is called a "pinned layer" or a "magnetization fixed layer") of the ferromagnetic layers by a bias magnetic field or the like, and allowing the direction of magnetization of the other ferromagnetic layer (which is called a "free layer" or a "magnetization free layer") to relatively change with respect to the pinned layer in response to the magnetic field from a recording medium (see Phys. Rev. B., Vol. 45, 806 (1992), J. Appl. Phys., Vol. 69, 4774 (1991), etc.).

The inventors have proposed a nano oxide layer specular spin-valve (NOL-SPSV) film which utilizes the specular (mirror reflection) effect to improve the rate of change in MR and which has a practical spin-valve film structure (Kamiguchi et al., "CoFe SPECULAR SPIN VALVES WITH A NANO OXIDE LAYER", Digests of Intermag '99, DB-01, 1999). A very thin oxide film called a nano oxide layer (NOL) is inserted into a free (magnetization free) layer or a pinned (magnetization fixed) layer to allow conduction electrons to reflect on its interface to allow a spin-valve film to serve as a pseudo artificial lattice film, so that it is possible to improve the rate of change in MR. With this structure, the inventors succeeded in greatly improving the rate of change in MR of a spin-valve film.

A specular spin-valve (SPSV) film wherein an oxide is stacked on a free layer or a pinned layer to utilize the specular reflection of electrons on its interface to extend a mean free path to obtain a great magnetoresistance effect is widely noticed as a technique for realizing a recording density of 50 gigabits square inch (Gbpsi) or more. In order to use the SPSV as a practical device, there has been proposed a structure wherein an oxide layer of a few nanometers is inserted into a pinned layer or a structure wherein an oxide layer is stacked on a free layer.

However, it is very difficult to insert a NOL into a pinned layer to maintain a high specular rate while holding a magnetically sufficient strong coupling of top and bottom pinned layers via the NOL.

For example, when oxygen gas is caused to flow to form a NOL, if the oxygen exposure amount is increased at an oxidizing step of forming the NOL in order to obtain a high specular rate, there is a problem in that the magnetic coupling via the NOL is weakened whereas the specular rate is not so improved.

Inversely, if oxidation is carried out at a weak oxygen exposure amount, there is a problem in that the magnetic coupling of the top and bottom pinned layers via the NOL increases whereas a high specular rate is not obtained and the rate of change in MR is not so improved.

In addition, the simple method for causing the flow of oxygen has the merit of having a good controllability from a low amount of oxygen to a high amount of oxygen since it has only to control the flow of oxygen. However, since no energy is applied in the oxidizing process, the control range of physical properties of a NOL capable of being formed is narrow, and the control range in the process is also very narrow.

On the other hand, in order to form a NOL having a high specular rate and a small influence of oxygen diffusion by a stable oxide, there is also the idea that a high energy process is used without using the above described simple oxidation based on the flow of oxygen.

For example, there is a method for making the plasma of oxygen as an ion beam to irradiate the surface of a film, which is to be oxidized, with the ion beam. This technique is effective in a high energy process. However, since the surface of a sample is exposed to suspended oxygen before oxygen plasma is fired (produced), there is a problem in that an oxide film is formed by simple oxygen gas, so that the same layer as a natural oxide film is formed in the portion of an initially grown NOL. The initial NOL layer produced at a low energy and at a low reactivity decreases ΔGs which serves as an index of a rate of change in MR.

This is the same in the case of plasma oxidation and radical oxidation. Although it is possible to carry out a high energy oxidation by plasma energy, there is a problem in that the portion of the initially grown NOL is always influenced by a natural oxide film based on suspended oxygen.

As described above, in the case of the natural oxidizing method, the controllability of the oxygen exposure amount from the low flow amount of oxygen to the high flow amount of oxygen is relatively excellent, whereas it is not possible to obtain a high specular rate since no energy is applied during oxidation. On the other hand, the IBO, the radical oxidation and the plasma oxidation are effective in a high energy oxidation, whereas there are problems in that it is not sufficiently control the amount of oxygen so that it is not possible to control a low amount of oxygen and that a natural oxide film is also formed as an initially grown NOL.

The inventors concluded that it is very difficult to obtain a stable oxide by a natural oxidation by which no energy is supplied, in order to obtain a high specular rate and thermally stabilize oxygen in a NOL. However, in the conventional high energy process, it is difficult to control a low amount of oxygen, and the initially grown NOL always becomes a natural oxide film.

It has been reported that magnetoresistance (MR) improving results are obtained if a structure wherein an oxide of Ta, Fe, Ni or Al is stacked directly on a magnetic layer of a free layer is used as an electron reflective layer on the side of the free layer. It also has been reported a SV film using a spin filter (SF) structure can also obtain MR improving effects due to an electron reflective layer.

The SF is a structure wherein a high conductive layer is stacked on a free layer, a structure which is effective in a bias point design in the output of a magnetic head, and a structure which is necessary for a magnetic head corresponding to a high recording density. It has been reported that a structure wherein a Ta oxide is formed on a Cu high conductive layer in this SF structure has MR improving effects. A structure wherein an NiO film having a thickness of 10 nm is formed on a Cu high conductive layer also has been reported.

However, oxides of Ta, Fe and Al among the above described oxides are multi-phases in which an amorphous or several kinds of crystalline structures exist. In such a case, the electron reflective effect decreases, so that it is not possible to sufficiently increase the MR. In addition, with respect to thermal stability, these fine structures are easy to cause diffusion and transformation to cause the deterioration of MR characteristics. Moreover, the quality of NiO is not so sufficiently good unless its thickness is about more than 10 nm, that the increase of the MR based on the electron reflective effect is small.

With the improvement of recording density, it has been requested to decrease the whole thickness of an SV film. From this point of view, it is difficult to use the above described electron reflective layer having a thickness reaching 10 nm for a device.

Moreover, when a magnetic head including an SV film is prepared, an alumina layer is formed above and below the SV film as an insulating layer. However, the alumina layer is simply formed on an oxide of amorphous, oxygen diffuses into the alumina layer from the oxide to produce portions in which a partially oxygen deficiency state is caused in an electron reflective layer and the oxide is reduced to a metal.

In general, it is required to stack a Ta metal on the uppermost portion of a few nm. However, also in this case, O2 is absorbed into the Ta metal to reduce a part of an electron reflective layer, so that an oxygen deficiency portion and a reduced metal portion appear in the electron reflective layer. These greatly cause to reduce the electron reflective effect, cause deterioration of output, and cause deterioration of long-term thermal stability.

As described above, in the conventional structure wherein the oxide electron reflective layer is stacked on the side of the free layer, the MR is improved, whereas there are many problems as a device which is put to practical use, so that it is difficult to put the device to practical use.

SUMMARY OF THE INVENTION

It is therefore an object of the present invention to eliminate the aforementioned problems and to realize a magnetoresistance effect element having a high sensitivity and a high reliability.

In order to accomplish the aforementioned and other objects, according to one aspect of the present invention, a magnetoresistance effect element comprises two ferromagnetic layers, a non-magnetic layer provided between the ferromagnetic layers, and a layer containing the oxide or nitride as the principal component containing a magnetic transition metal element which does not bond to oxygen and nitrogen and which is at least one of Co, Fe and Ni.

Furthermore, the layer containing the oxide or nitride as the principal component may contain a larger amount of rare gas, which is at least one of argon, xenon, helium, krypton and neon, than that of a layer contacting the layer containing the oxide or nitride as the principal component.

The atomic composition of the rare gas contained in the layer containing the oxide or nitride as the principal component may be twice or more as much as the atomic composition of the rare gas contained in the layer which contacts the layer containing the oxide or nitride as the principal component.

The layer containing the oxide or nitride as the principal component has preferably a thickness of 1 nm or more and not thicker than 3 nm.

The layer containing the oxide or nitride as the principal component preferably contains an oxide or nitride of any one of Fe, Co, Ni, Mn, Cr, V, Ti, Zr, Mo, Hf, Ta, W and Al.

Preferably, one of the two ferromagnetic layers is a magnetization fixed layer having a magnetization direction which is substantially fixed to one direction, and the other ferromagnetic layer is a magnetization free layer having a magnetization direction which varies in response to an external magnetic field, the magnetoresistance effect element having a resistance which varies in response to a relative angle between the magnetization direction of the magnetization fixed layer and the magnetization direction of the magnetization free layer.

Preferably, the magnetization fixed layer comprises a plurality of stacked layers, and the layer containing the oxide or nitride as the principal component is provided between layers constituting the magnetization fixed layer.

A thickness of the layer constituting the magnetization fixed layer between the non-magnetic layer and the layer containing the oxide or nitride as the principal component is preferably in the range of 1 nm to 3 nm.

The magnetization fixed layer may comprise: a layer having a magnetization direction substantially fixed to one direction; a second non-magnetic layer; and a third ferromagnetic layer which antiferromagnetically bonds to the layer having the magnetization direction substantially fixed to one direction, via the second non-magnetic layer.

The layer having the oxide or nitride as the principal component may contact the opposite surface of the magnetization free layer to the non-magnetic layer via the second non-magnetic layer.

The total thickness of the magnetization free layer and the second non-magnetic layer is preferably in the range of 2 nm to 4 nm.

However, the magnetoresistance effect element should not be limited to a spin-valve type magnetoresistance effect element which will be described in the embodiments of the present invention, but the present invention may be applied to an multi-layered type giant magnetoresistance effect element to which a ferromagnetic layer is magnetically coupled, or a tunneling magnetoresistance effect element which uses a non-magnetic insulating layer as a non-magnetic layer, to obtain the same effects.

A method for fabricating a magnetoresistance effect element according to an aspect of the present invention is a method for fabricating a magnetoresistance effect element having two ferromagnetic layers and a non-magnetic layer provided between these ferromagnetic layers, and comprises oxidizing or nitriding the surface of a base metal to form a layer containing an oxide or nitride as a principal component by irradiating the surface of the base metal with ions or plasma of a rare gas in an atmosphere of at least one of oxygen and nitrogen.

The forming the layer containing the oxide or nitride as the principal component preferably includes producing the ions or plasma of the rare gas, irradiating the surface of the base metal with the ions or plasma of the rare gas and substantially simultaneously feeding at least one of oxygen and nitrogen to the atmosphere, and stopping the irradiation of the base metal with the ions or plasma of the rare gas and substantially simultaneously stopping the feeding of at least one of oxygen and nitrogen to the atmosphere.

The forming the layer containing the oxide or nitride as the principal component preferably includes feeding the rare gas to an ion source to produce ions or plasma of the rare gas, irradiating the surface of the base metal with the ions or plasma of the rare gas and substantially simultaneously feeding at least one of oxygen and nitrogen to the ion source, and stopping the irradiation of the base metal with the ions or plasma of the rare gas and substantially simultaneously stopping the feeding of at least one of oxygen and nitrogen to the ion source.

Alternatively, a method for fabricating a magnetoresistance effect element according to an aspect of the present invention is a method for fabricating a magnetoresistance effect element having two ferromagnetic layers and a non-magnetic layer provided between these ferromagnetic layers, and includes oxidizing or nitriding the surface of a base metal to form a layer containing an oxide or nitride as a principal component, the forming the layer containing the oxide or nitride as the principal component comprising: producing the plasma of a rare gas; and feeding any one of oxygen and nitrogen to an atmosphere, in which the plasma of the rare gas is produced, after the producing the plasma of the rare gas.

If oxygen radicals are first intended to be produced when initial radical plasmas are produced in radical oxidation, simple oxygen gas which is not in a radical state leaks into a chamber to form a dirty natural oxide film. On the other hand, according to the above described construction, after only the plasma of a rare gas is first produced when radical plasma is produced, and oxygen gas is fed (e.g., oxygen is fed to a radical source) when the plasma is stabilized, and oxidation is started simultaneously with the feeding of oxygen gas. In conventional radical oxidation, there is not such an idea.

Any one of oxygen and nitrogen is preferably fed after it is verified that the production of the plasma of the rare gas is stabilized.

The base metal preferably contains at least one of Fe, Co, Ni, Mn, Cr, V, Ti, Zr, Mo, Hf, Ta, W and Al.

In addition, oxygen has a Langmuir of 600 or less.

The irradiation time with the ions of the rare gas is preferably in the range of from 5 seconds to 60 seconds.

The time difference between the timing in irradiating the surface of the base metal with the ions of the rare gas and the timing in exposing the surface of the base metal to at least one of oxygen and nitrogen is preferably 15 seconds or less.

The irradiation of the surface of the base metal with ions is preferably carried out by the irradiation with ion beam.

The accelerating energy of the ion beam is preferably in the range of 50 eV or more and 150 eV or less.

The ions of the rare gas are preferably produced by RF exited plasma.

Preferably, also in any one of the above described fabricating methods, one of the two ferromagnetic layers is a magnetization fixed layer having a magnetization direction which is substantially fixed to one direction, and the other ferromagnetic layer is a magnetization free layer having a magnetization direction which varies in response to an external magnetic field, the magnetoresistance effect element having a resistance which varies in response to a relative angle between the magnetization direction of the magnetization fixed layer and the magnetization direction of the magnetization free layer.

However, the magnetoresistance effect element should not be limited to a spin-valve type magnetoresistance effect element which will be described in the embodiments of the present invention, but the present invention may be applied to an multi-layered type giant magnetoresistance effect element to which a ferromagnetic layer is magnetically coupled, or a tunneling magnetoresistance effect element which uses a non-magnetic insulating layer as a non-magnetic layer, to obtain the same effects.

A system for fabricating a magnetoresistance effect element according to an aspect of the present invention is a system for fabricating a magnetoresistance effect element having two ferromagnetic layers and a non-magnetic layer provided between these ferromagnetic layers, and is characterized in that the surface of a base metal mounted in an oxidizing chamber is irradiated with ions of a rare gas, and substantially simultaneously the surface is exposed to at least one of oxygen and nitrogen of 1000 Langmuir or less, to oxide or nitride the surface of the base metal to be capable of forming a layer containing an oxide or nitride as a principal component.

Preferably, one of the two ferromagnetic layers is a magnetization fixed layer having a magnetization direction which is substantially fixed to one direction, and the other ferromagnetic layer is a magnetization free layer having a magnetization direction which varies in response to an external magnetic field, the magnetoresistance effect element having a resistance which varies in response to a relative angle between the magnetization direction of the magnetization fixed layer and the magnetization direction of the magnetization free layer.

However, the magnetoresistance effect element should not be limited to a spin-valve type magnetoresistance effect element which will be described in the embodiments of the present invention, but the present invention may be applied to an multi-layered type giant magnetoresistance effect element to which a ferromagnetic layer is magnetically coupled, or a tunneling magnetoresistance effect element which uses a non-magnetic insulating layer as a non-magnetic layer, to obtain the same effects.

The ions of the rare gas are preferably produced by a plasma source capable of producing the plasma of a rare gas which is at least one of argon, Xe, He, Kr and Ne.

The accelerating energy of the ions is preferably in the range of 50 eV or more and 150 eV or less.

At least one of oxygen and nitrogen preferably has a Langmuir of 1000 or less.

The current per unit square inch of a positive grid, which flows through the grid for the accelerating voltage for the positive grid of the ion source for producing the ions of the rare gas, is preferably capable of being controlled to be in the range of from 0.1 mA/inch$^2$ to 1 mA/inch$^2$.

A layer containing an oxide or nitride as the principal components may be formed in an oxidation chamber. The oxidation chamber may be connected to a transfer vacuum chamber, which has means for transferring a wafer having the base metal on its surface, via a vacuum valve. The transfer vacuum chamber may also be connected to a vacuum chamber for metal sputtering deposition via a vacuum valve.

According to another aspect of the present invention, a magnetoresistance effect element comprises: a magnetization fixed layer having a ferromagnetic layer having a magnetization direction which is substantially fixed to one direction; a magnetization free layer having a ferromagnetic layer having a magnetization direction which varies in response to an external magnetic field; a non-magnetic intermediate layer which is provided between the magnetization fixed layer and the magnetization free layer; a high conductive layer having a higher conductivity than those of the magnetization fixed layer and the magnetization free layer, being stacked on one side of the magnetization free layer remoter from the non-magnetic intermediate layer; and a non-magnetic crystalline layer provided on one side of the high conductive layer remoter from the magnetization free layer and containing a compound of an element, which is different from the principal element constituting the high conductive layer, as a principal component, the non-magnetic crystalline layer having a substantially non-magnetism and being substantially crystalline.

A spin filter (SF) structure wherein the high conductive layer is stacked the a magnetization free layer is a construction necessary for the design of a bias point, and is required to stop the diffusion between the non-magnetic crystalline layer also serving as an electron reflective layer and the free layer to obtain good magnetically soft characteristics of the free layer. In the non-magnetic crystalline layer stacked thereon, it is required for electron potential to rapidly vary in order to obtain good electron reflection. From this point of view, the non-magnetic crystalline layer is preferably crystalline. If the non-magnetic crystalline layer is a mixed layer wherein a plurality of phases are mixed, the distribution of electron potential occurs on the interface, so that it is impossible to sufficiently obtain electron reflective characteristics. For that reason, the non-magnetic crystalline layer is preferably a layer with a single phase.

The non-magnetic crystalline layer preferably contains at least one of oxides of B, Si, Ge, W, Nb, Mo, P, V, Sb, Zr, Ti, Zn, Pb, Cr, Sn, Ga, Fe, Co and rare earth metals.

Because the bond energy to oxygen is greater than that of copper (Cu), which is mainly used as a high conductive electron layer, to be easily oxidized to easily obtain a stable oxide and to be difficult to cause oxygen from diffusing in the interface to Cu.

In these magnetoresistance effect elements, the thickness of the non-magnetic crystalline layer is preferably 5 nm or less. Because the thickness is beyond the range satisfying the requirement of the decrease of the thickness of a film with the requirement of a high magnetic recording density if the thickness is too large. If the thickness is less than 0.5 nm, it is difficult to provide a uniform quality film by a heat treatment or the like, so that the electron reflective characteristics deteriorate. For that reason, the thickness is preferably 0.5 nm or more.

According to another aspect of the present invention, a magnetoresistance effect element comprises: a magnetization fixed layer having a ferromagnetic layer having a magnetization direction which is substantially fixed to one direction; a magnetization free layer having a ferromagnetic layer having a magnetization direction which varies in response to an external magnetic field; a non-magnetic intermediate layer which is provided between the magnetization fixed layer and the magnetization free layer; a high conductive layer having a higher conductivity than those of the magnetization fixed layer and the magnetization free layer, being provided on one side of the magnetization free layer remoter from the non-magnetic intermediate layer; a first compound layer provided on one side of the high conductive layer remoter from the magnetization free layer, and containing a compound of an element, which is different from the principal element constituting the high conductive layer, as a principal component; and a second compound layer provided on one side of the first compound layer remoter from the high conductive layer.

For example, the "compound" means an oxide, a nitride, a boride, a carbide or the like.

When the first compound layer is an oxide of the same material as the high conductive layer, the oxidizing energy is the same, so that the diffusion of oxygen is easy to occur in the electron reflective layer. For that reason, the first compound layer is preferably an oxide of a different material from that of the high conducive layer. In this case, in order to mainly prevent oxygen from diffusing into a protective layer or an insulating layer which are stacked on the top of the first compound layer, a diffusion barrier layer is preferably provided.

If the first compound layer contains an oxide of a first element selected from a ranking of elements consisting of B, Si, Ge, Ta, W, Nb, Al, Mo, P, V, As, Sb, Zr, Ti, Zn, Pb, Th, Be, Cd, Sc, La, Y, Pr, Cr, Sn, Ga, Cu, In, Rh, Pd, Mg, Li, Ba, Ca, Sr, Mn, Fe, Co, Ni, and Rb, as a principal component, and if the second compound layer contains an oxide of an element of the ranking of elements arranged after the first element, as a principal component, it is possible to more stably form the oxide.

Because it can function as a barrier for inhibiting the diffusion of oxygen in the oxide layer nearest to the high conductive layer since the element positioned at the more rear position in the above described ranking has a lower bond energy to oxygen to be difficult to be oxidized.

In these magnetoresistance effect elements, the thickness of the electron reflective layer is preferably 5 nm or less. Because the thickness is beyond the range satisfying the requirement of the decrease of the thickness of a film with the requirement of a high magnetic recording density if the thickness is too large. If the thickness is less than 0.5 nm, it is difficult to provide a uniform quality film by a heat treatment or the like, so that the electron reflective characteristics deteriorate. For that reason, the thickness is preferably 0.5 nm or more.

The thickness of the magnetization free layer may be thin to some extend in order to cause the electron reflective effect to effectively contribute to the improvement of the MR. Specifically, the thickness is preferably 5 nm or less. However, if the thickness is too thin, the difference between the mean free paths of up-spin electrons and down-spin electrons decreases to conspicuously decrease the MR effect, so that the thickness is preferably 1 nm or more. In addition, the magnetization free layer may be formed of a Co alloy or may have a stacked structure of a Co alloy and an Ni alloy. In order to obtain the electron reflective effect, the magnetization free layer is preferably formed of a monolayer of a Co alloy since electron scattering which does not contribute to the MR can be avoided if the number of the lamination interfaces is smaller.

According to another aspect of the present invention, a magnetoresistance effect element comprises: a magnetization fixed layer having a ferromagnetic layer having a magnetization direction substantially fixed to one direction; a magnetization free layer having a ferromagnetic layer having a magnetization direction varying in response to an external magnetic field; and a non-magnetic intermediate layer provided between the magnetization fixed layer and the magnetization free layer, a high conductive layer having a higher conductivity than those of the magnetization fixed layer and the magnetization free layer, the high conductive layer being stacked on the one side of the magnetization free layer remoter from the non-magnetic intermediate layer, and a layer containing an oxide of an element different from the principal element constituting the high conductive layer, as a principal component and which is formed by the irradiation with an ionized gas, is stacked on the high conductive layer.

According to another aspect of the present invention, a magnetoresistance effect element comprises: a magnetization fixed layer having a ferromagnetic layer having a magnetization direction substantially fixed to one direction; a magnetization free layer having a ferromagnetic layer having a magnetization direction varying in response to an external magnetic field; and a non-magnetic intermediate layer provided between the magnetization fixed layer and the magnetization free layer, a high conductive layer having a higher conductivity than those of the magnetization fixed layer and the magnetization free layer, the high conductive layer being stacked on the one side of the magnetization free layer remoter from the non-magnetic intermediate layer, and a layer containing an oxide of an element different from the principal element constituting the high conductive layer, as a principal component and being formed by the irradiation with a plasma gas, is stacked on the high conductive layer.

In these magnetoresistance effect elements, it is required to adjust the thickness of the high conductive layer in order to obtain a magnetic field due to current required for the adjustment of a bias point, and the thickness of the high conductive layer is preferably 3 nm or less since the variation in MR considerably decreases if the thickness generally exceeds 3 nm. On the other hand, if the thickness of the high conductive layer is less than 0.5 nm, the diffusion of oxygen or the like occurs between the high conductive layer and the layer serving as the electron reflective layer to be an obstacle to magnetically soft characteristics, so that the thickness is preferably 0.5 nm or more. In particular, if the electron reflective layer has a magnetic order of an antiferromagnetic material or the like, there is some possibility that a magnetic coupling occurs, so that the thickness may be 0.5 nm or more, and is preferably 0.8 nm or more.

According to a further aspect of the present invention, a magnetoresistance effect element comprises: a magnetization fixed layer having a ferromagnetic layer having a magnetization direction substantially fixed to one direction; a magnetization free layer having a ferromagnetic layer having a magnetization direction varying in response to an external magnetic field; a non-magnetic intermediate layer provided between the magnetization fixed layer and the magnetization free layer; a metallic layer provided on one side of the magnetization free layer remoter from the non-magnetic intermediate layer, and containing at least one of Cu, Au, Ag, Ru, Ir, Re, Rh, Pt, Pd, Al, Os and Ni as a principal component; and a non-magnetic crystalline layer provided on one side of the metallic layer remoter from the magnetization free layer, and containing a compound of an element, which is different from the principal element constituting the metallic layer, as a principal component, the non-magnetic crystalline layer having a substantially non-magnetism and being substantially crystalline.

According to a still further aspect of the present invention, a magnetoresistance effect element comprises: a magnetization fixed layer having a ferromagnetic layer having a magnetization direction substantially fixed to one direction; a magnetization free layer having a ferromagnetic layer having a magnetization direction varying in response to an external magnetic field; a non-magnetic intermediate layer provided between the magnetization fixed layer and the magnetization free layer; a metallic layer provided on one side of the magnetization free layer remoter from the non-magnetic intermediate layer, and containing at least one of Cu, Au, Ag, Ru, Ir, Re, Rh, Pt, Pd, Al, Os and Ni as a principal component; a first oxide layer provided on the one side of the metallic layer remoter from the magnetization free layer; and a second oxide layer provided on one side of the first oxide layer remoter from the high conductive layer.

Also in any one of the above described magnetoresistance effect elements, it is possible to enhance the electron reflective effect by forming the electron reflective layer in the magnetization fixed layer. Because it is possible to obtain the same structure as that of a pseudo magnetic multi-layer if the electron mirror reflection occurs on both faces.

In the above described structure, the magnetization fixed layer also has a structure called a synthetic antiferromagnetic structure wherein ruthenium (Ru) is formed between ferromagnetic layers, so that it is possible to improve the design of the bias point and to enhance the magnetic stability of the pinned layer.

In these SV films, the exchange bias film of the pinned layer may use an Mn antiferromagnetic material, such as PtMn, IrMn, NiMn, FeMn, RhMn or RuMn.

These magnetoresistance effect element may be effectively a bottom type SV wherein an antiferromagnetic film is formed below a pinned layer, or a top type SV wherein an antiferromagnetic film is formed above a pinned layer.

The above described magnetoresistance effect element can be used as a magnetic head for reading recording data out of a medium in a magnetic recording and/or reading system. It can also be used as a magnetic random access memory (MRAM).

On the other hand, the magnetic reading system according to the present invention has any one of the above described magnetoresistance effect elements, and is capable of reading magnetic information recorded in a magnetic recording medium.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DESCRIPTION OF THE EMBODIMENTS

Figure 1:
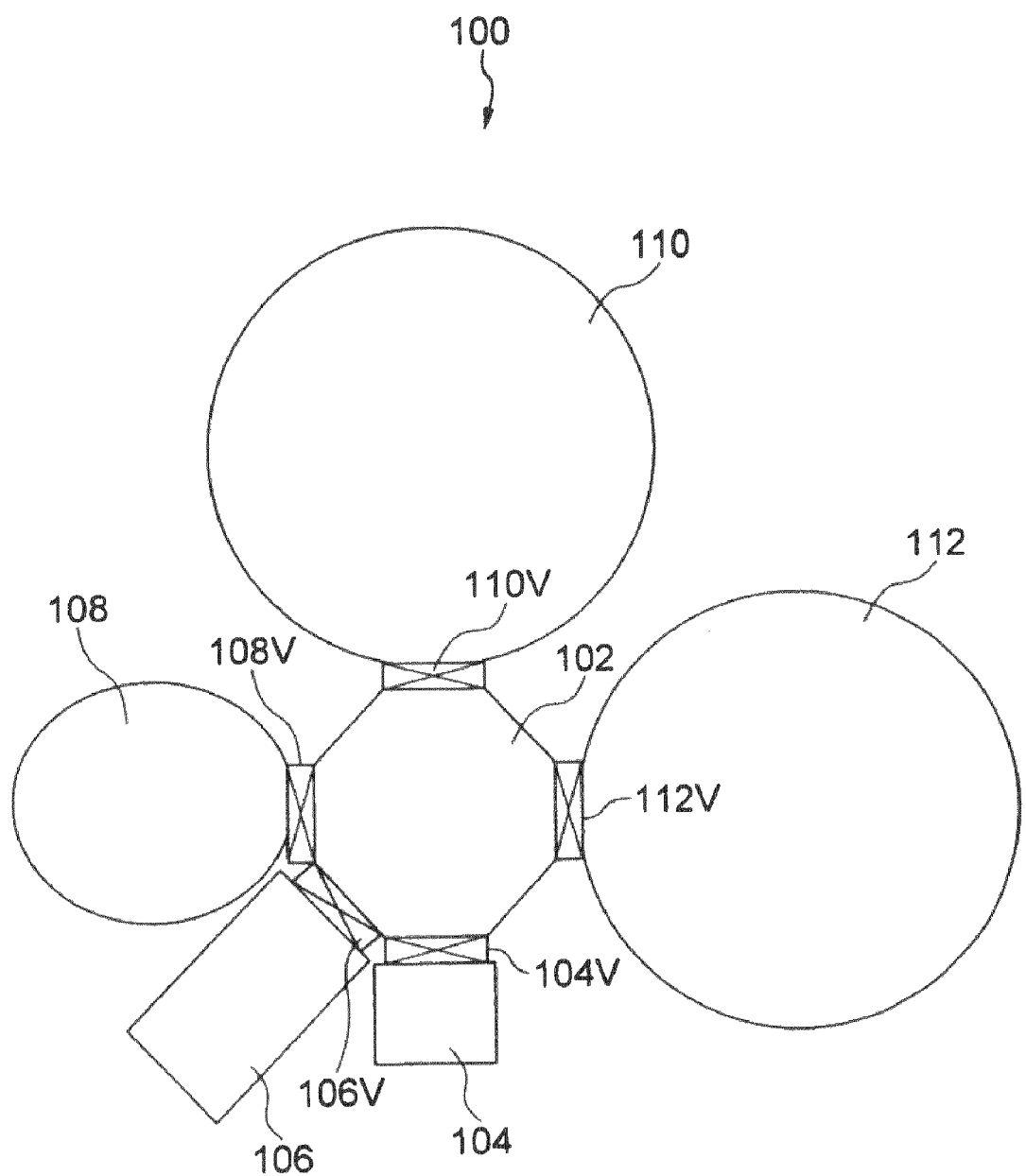
FIG. 1 is a schematic diagram showing the construction of a deposition system by which a NOL-SPSV film was formed in the first embodiment of the present invention.

The inventors concluded that a stable oxide to which energy is supplied from an initial NOL can be obtained by a fabricating method for independently carrying out the application of energy and the supply of oxygen. That is, in the conventional high energy process, oxygen is supplied to an oxidizing chamber after being changed to be in a plasma state, whereas according to an aspect of the present invention, it was concluded that this is not always important and that it is most desired to independently supply energy and oxygen.

That is, it was found that it is important to prevent the surface of a film, which is to be oxidized, to be exposed to simple molecular oxygen gas in a state that the gas is not assisted by high energy ions or in a state which does not become a radical state, i.e., in a state which is not a high reactivity.

Specifically, for example, when the supply of energy by ion beam is considered, it was found that a high energy oxide film having no natural oxide film can be obtained from an initial NOL by a sequence wherein ion beam of a rare gas, which does not contain oxygen, such as argon, Xe, Ne or He, is basically used and wherein oxygen gas is first introduced into an oxidizing chamber when the surface of a base metal is irradiated with the ion beam after the irradiation with the ion beam is prepared.

A method for supplying oxygen to the oxidizing chamber may be a method for oxygen directly to the oxidizing chamber regardless of an ion source or a method for supplying rare gas ion beam to the same ion source.

Thus, an oxidizing method according to the present invention for supplying ions in addition to oxygen and nitrogen gases, which are to be allowed to react, by utilizing the assist effect based on rare gas ions as a high energy process is named IAO (Ion Assisted Oxidation).

The basic idea according to the present invention is that supply lines for oxygen and nitrogen gases supply oxygen and nitrogen gases to the oxidizing chamber as usual molecular gases since oxygen and nitrogen to be allowed to react are not particularly required to be ionized.

However, by using a new process sequence based on IAO according to an aspect of the present invention for preventing oxygen and nitrogen from being introduced into the oxidation chamber before applying energy based on ions and plasma according to another aspect of the present invention, it can be carried out even if oxygen and nitrogen are supplied to an ion gun of a conventional IBO (Ion Beam Oxidation) system. In addition, only an oxygen plasma oxidation process sequence is changed in a usual plasma oxidation. This idea of the process sequence based on IAO can be applied to conventional techniques using plasma oxidation and radical oxidation. For example, there is the idea that the irradiation with the plasma of oxygen is carried out in a usual plasma oxidation, whereas according to an aspect of the present invention, oxygen and nitrogen gases may be supplied to a place, which is irradiated with the plasma of a rare gas, such as argon or Xe, in a molecular state, so that it is possible to control a small amount of oxygen and a small amount of nitrogen.

In a case where the technique according to an aspect of the present invention is applied to a radical oxidation, only a rare gas is introduced without introducing oxygen gas in a stage that plasma is produced by a radical source, and oxygen gas is introduced into the radical source to start an oxidizing step after the plasma of the rare gas is stabilized. In the conventional radical oxidizing method, oxygen gas is introduced into the radical source in the stage that the initial plasma is produced. Therefore, simple oxygen molecular gas, which does not have a high reactivity and which is not in a radical state, reaches the surface of the film, so that a dirty natural oxide film is formed in a low reactive process. On the other hand, according to an aspect of the present invention, it is possible to prevent the production of a dirty natural oxide film by optimizing the timing in introducing oxygen gas into the radical source.

Referring now to examples, the embodiments of the present invention will be described below in detail.

First Embodiment

First, as the first embodiment of the present invention, an example for applying a NOL based on oxidation at a small amount of oxygen using an IAO oxidation, to a magnetoresistance effect element having a spin-valve structure will be described below.

In this embodiment, a NOL-SPSV (NOL-specular reflection spin-valve) film having the following stacked structure was formed. A numeral in parentheses for each of layers denotes the thickness (nanometer) of the film.

| | |
|---|---|
| Ta (2 nm) | Cap Layer |
| TaO | Reflective Layer |
| Cu (1 nm) | High Conductive Layer |
| CoFeNi (2 nm) | Free Layer |
| Cu (2.2 nm) | Non-magnetic Intermediate Layer |
| CoFe (2 nm) | Pinned layer ② |
| NOL | NOL |
| CoFe (1 nm) | Pinned layer ① |
| PtMn (10 nm) | Antiferromagnetic Layer |
| NiFeCr (5 nm) | Underlying Film ② |
| Ta (3 nm) | Underlying Film ① |
| Substrate | Substrate |

In an actual head, an "alutic substrate" wherein amorphous alumina is coated on a shielding film is used as a substrate. However, a thermally oxidized silicon substrate was used when film characteristics were evaluated. It has been verified that film characteristics are not different therebetween. In this embodiment, a thermally oxidized silicon substrate was used. Furthermore, even if a silicon substrate coated with amorphous alumina is used, film characteristics are not different.

FIG. 1 is a schematic diagram showing the construction of a deposition system by which a NOL-SPSV film was formed in this embodiment.

That is, in this deposition system 100, a pre-cleaning chamber 106, a load-lock chamber 104, an oxidizing chamber 108 and two metal deposition chambers 110 and 112 are connected to a transfer chamber 102 via vacuum valves 104V through 112V, respectively. In the respective processes which will be described later, a wafer is transferred from the respective chambers via the transfer chambers.

The wafer is introduced into the load-lock chamber 104, the pressure of which is atmospheric pressure. Also at this time, in all of other chambers, the back pressure in a state that no process gas is introduced is held at a higher vacuum than $8 \times 10^{-8}$ Torr. The load-lock chamber is connected to the transfer chamber via the vacuum valve 104V.

The metal deposition chambers 110 and 112 are suitable for the deposition of a metal thin film so as to be capable of depositing a spin-valve film. At least one of the metal deposition chambers is a multi-source system which is six-source or more system, and may be a PVD (Physical Vapor Deposition) sputter chamber of a DC or RF system, or an IBD (Ion Beam Deposition) sputter chamber. It is not always required to provide two metal deposition chambers as illustrated in FIG. 1. Only one metal deposition chamber may be provided if the number of materials of the spin-valve film is sufficient. In the film with the construction in this embodiment, a portion of a metal film was deposited in the metal deposition chambers 110 and 112 capable of carrying out a six-source PVD of a DC magnetron system.

The wafer set in the load-lock chamber 104 is first cleaned with argon ion beams in the pre-cleaning chamber 106 to remove matters which are absorbed onto the surfaces thereof. While the pre-cleaning chamber 106 has been herein used, a sputtering of PVD may be carried out in the metal deposition chamber 110 or 112, or the wafer may be cleaned by an assist gun of IBD. This process may be omitted if no contamination exists on the surface of the substrate.

Thereafter, the wafer is transferred to the metal deposition chamber 110 or 112 of the PVD system, and a Ta layer, an NiFeCr layer, a PtMn layer and a CoFe layer are deposited therein, respectively.

Herein, Ta/NiFeCr of the underlying film may be formed of Ti, Zr, Hf, W, Nb, any one of their alloy materials, another material forming a buffer layer, or a seed layer material for promoting the face centered cubic (fcc) orientation in place of NiFeCr. If any one of these underlying buffer layers sufficiently performs its part, the underlying film may be a monolayer film, not a two-layer stacked film. In order to obtain good underlying buffer effects and seed effects, the total thickness of these underlying layers is preferably in the range of from 3 to 8 nm.

In place of the PtMn layer (antiferromagnetic layer) deposited thereon, another antiferromagnetic material, such as PdPtMn, IrMn or RuRhMn, may be deposited. The thickness of the deposited film is preferably in the range of from about 7 nm to about 15 nm. In this range, the thickness of the deposited film is more preferably as thin as possible if characteristics of an antiferromagnetic film can be obtained. Because it is required to reduce shunt since PtMn has a shunt effect to the rate of change in MR, and because the total thickness of the spin-valve film is preferably as thin as possible since it is required to narrow the gap with the enhancement of the density when the present invention is used for a shielding type head.

In place of the CoFe layer (pinned layer ①) deposited on the antiferromagnetic film, Co, Ni, Fe, NiFe or any one of these materials containing additional elements may be used. This film must not always be deposited when the material of this film can be also used as the material of a base metal film which will be deposited later to form an NOL. The thickness of this film is preferably 3 nm or less.

While the simple pin structure has been provided in this embodiment, a synthetic anti-ferri structure (Sy-AF structure) is preferably provided. In that case, Co, CoFe, NiFe or a magnetic material comprising any one of these metals and an additional element is deposited on the antiferromagnetic film of PtMn or the like, and Ru is deposited thereon so as to have a thickness of about 1 nm. A material deposited thereon forms a film which has the same part as that of CoFe of 1 nm deposited on PtMn in this embodiment. Therefore, even in the case of the Sy-AF structure, the following descriptions are substantially the same.

After the above described stacked metal film is formed, a metal film to be a portion designated as the NOL (Nano Oxide Layer) in the above described (1) is also deposited in the metal deposition chamber. Herein, $Fe_{50}CO_{50}$ was deposited so as to have a thickness of about 1 nm. Although oxide films can be suitably expressed by the term "NOL", the present invention should not always be limited only to oxide films. Throughout the specification, in place of the term "NOL", the term "magnetoresistance effect improving layer" will be also used as a general term including a thin film of any one of nitrides, oxides, borides and fluorides in addition to oxides.

That is, throughout the specification, the term "magnetoresistance effect improving layer" means a thin film which contains any one of these materials as a principal component and which is provided in a magnetoresistance effect element to serve to cause charged particles constituting a current, which is to be detected as a sense current, to reflect thereon.

The selection of a material of a base metal to be a magnetoresistance effect improving layer is very important in order to obtain a good specularity. In particular, the selection of a material of a magnetoresistance effect improving layer inserted on the side of a pinned layer is more important since it can also achieve a magnetic coupling. As one condition for both of a high specularity and a great magnetic coupling, the magnetoresistance effect improving layer preferably contains at least one of three magnetic metal elements of Co, Fe and Ni. The magnetoresistance effect improving layer may contain any one of Mn, Cr and V other than these three kinds of magnetic metal elements, and these base metals may contain any one of B, Ti, Zr, Mo, Hf, Ta, W and Al.

When an NOL is used as the magnetoresistance effect improving layer, the base metal is preferably formed of Fe or FeCo alloy, an NOL formed by oxidation from which has a high Neel temperature and a high Curie temperature. An additional element, such as Cr, B or C, may be added to any one of these materials. As will be described later, although the NOL containing $Fe_{50}CO_{50}$ as a base metal which was used in this embodiment can achieve both of a high specularity and a high magnetic coupling, the base metal of $Co_{90}Fe_{10}$ can not obtain a good magnetic coupling. Although the base metal may contain a larger amount of Fe than $Fe_{50}CO_{50}$, it does not preferably contain a larger amount of Co than $Fe_{50}CO_{50}$. In particular, when $Co_{90}Fe_{10}$ is used, a magnetic coupling can be obtained if natural oxidation only for causing oxygen to flow, not high energy oxidation like this process, is carried out. However, the specularity is clearly smaller than that when the IAO is used and $Fe_{50}CO_{50}$ is used as the base metal of the NOL according to the present invention, so that the specularity is insufficient.

Thereafter, the wafer is transferred to the oxidizing chamber. An NOL forming process in this chamber is a significant feature of embodiments of the present invention. An IAO process according to embodiments of the present invention is herein carried out.

Figure 2:
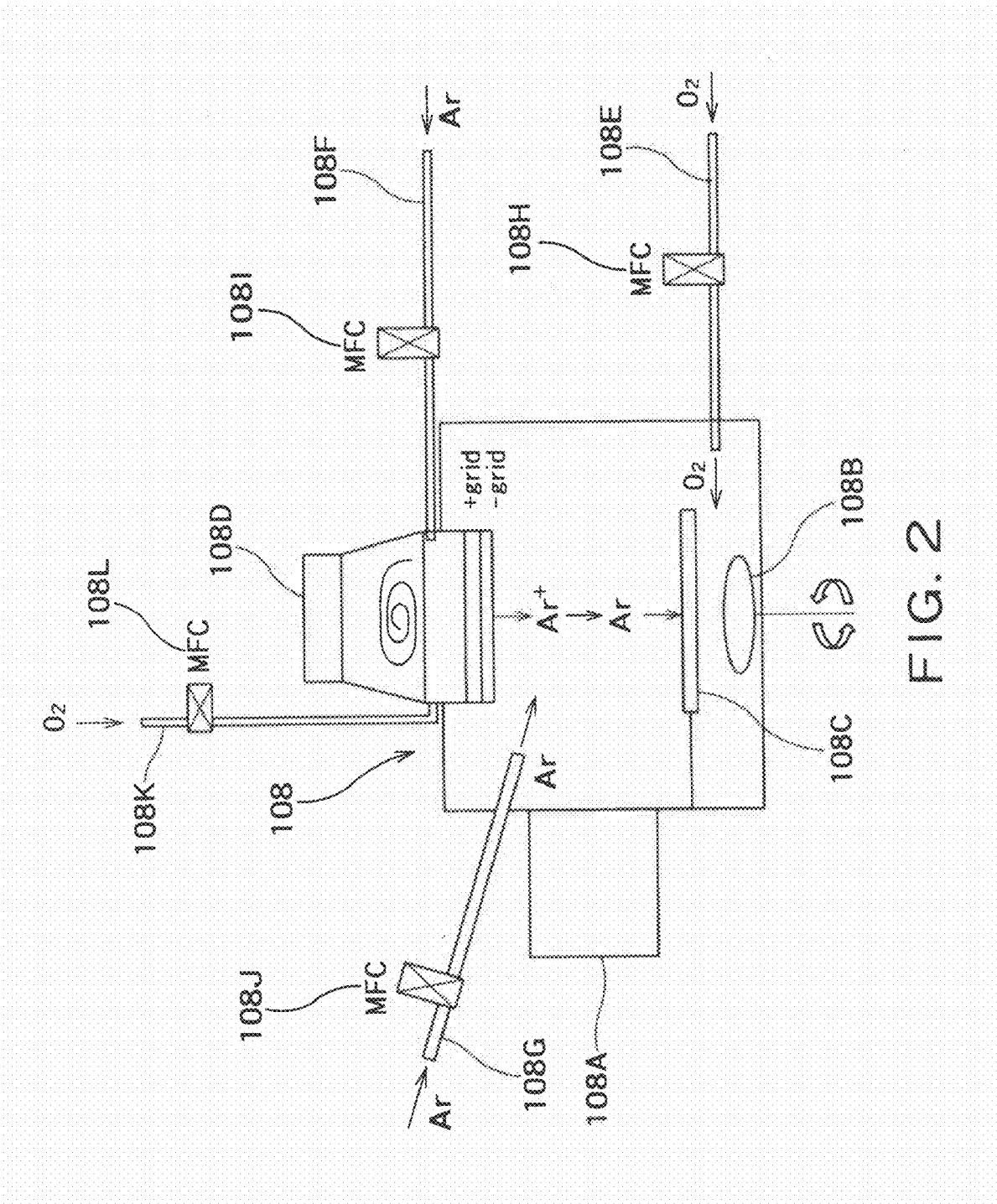
FIG. 2 is a conceptual drawing showing an example of the construction of an oxidizing chamber for carrying out an IAO process.

FIG. 2 is a conceptual drawing showing an example of the construction of an oxidizing chamber for carrying out an IAO process. That is, the oxidizing chamber 108 can be in a reduced pressure state by means of an exhaust pump 108A, such as a cryopump, a turbopump or a water pump. The oxidizing chamber 108 is provided with a holder 108B for supporting thereon a wafer, a shutter 108C and an ion source 108D. The oxidizing chamber 108 is also provided with an oxygen gas feed system 108E for supplying oxygen gas to the vicinity of the wafer, an ion source gas feed system 108F for feeding a gas to the ion source, and an argon feed system 108G for feeding argon gas to the oxidizing chamber. The feed systems have flow control means 108H, 108I, 108J, 108K and 108L, such as mass flow controllers, respectively.

One feature of the oxidizing chamber 108 for carrying out the IAO process is that the oxygen gas feed system 108E feeds oxygen directly to the surrounding of the wafer in the oxidizing chamber 108, not to the ion source 108D. In addition, the oxidizing chamber 108 has the ion source 108D as an energy supply source, and has an accelerating grid, a decelerating grid and a grand-grid. Moreover, the oxidizing chamber 108 has a neutralizer for neutralizing ions charged to plus (+). While argon gas has been herein used as the gas for ion source, a rare gas, such as Xe, He, Ne or Kr gas, may be used.

While the mechanism for causing ion beam to be perpendicularly (90°) incident on the surface of the film has been illustrated in FIG. 2, the ion beam may be obliquely incident thereon in order to control the thickness of the oxide film. At this time, as the incident angle is oblique, energy irradiation is carried out only in the vicinity of the surface of the film in place of the supply of energy in a thickness direction, so that it is possible to form an oxide film only on the surface of the film. That is, the system construction does not only correspond to a case where the incident angle of ion beams is 90°, but it may also correspond to a case where the incident angle is a low angle of up to about 10°.

Figure 3:
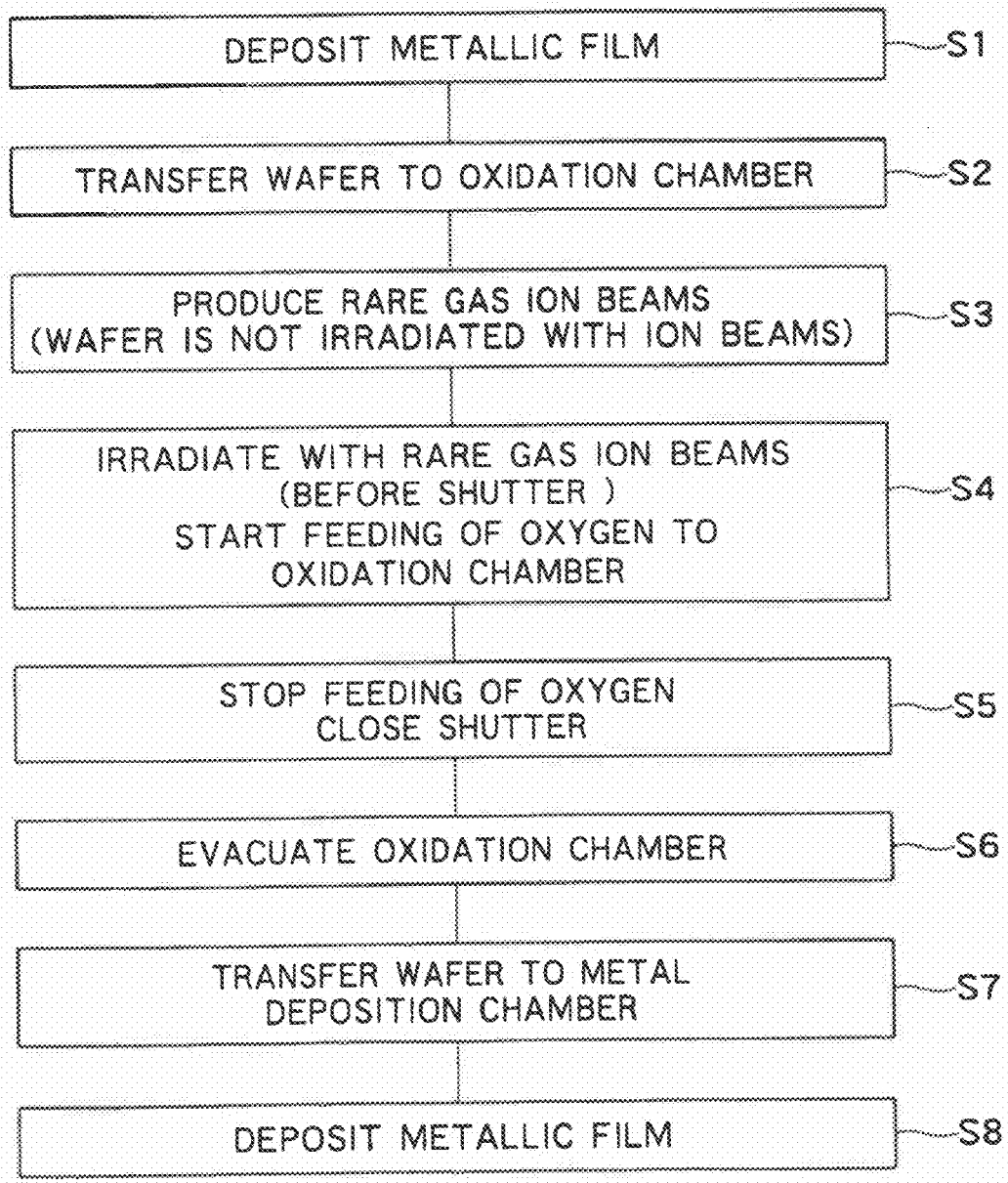
FIG. 3 is a flow chart showing a sequence of an oxidizing process and processes before and after the oxidizing process according to the present invention.

FIG. 3 is a flow chart showing a sequence of an oxidizing process and processes before and after the oxidizing process according to embodiments of the present invention.

Figure 4:
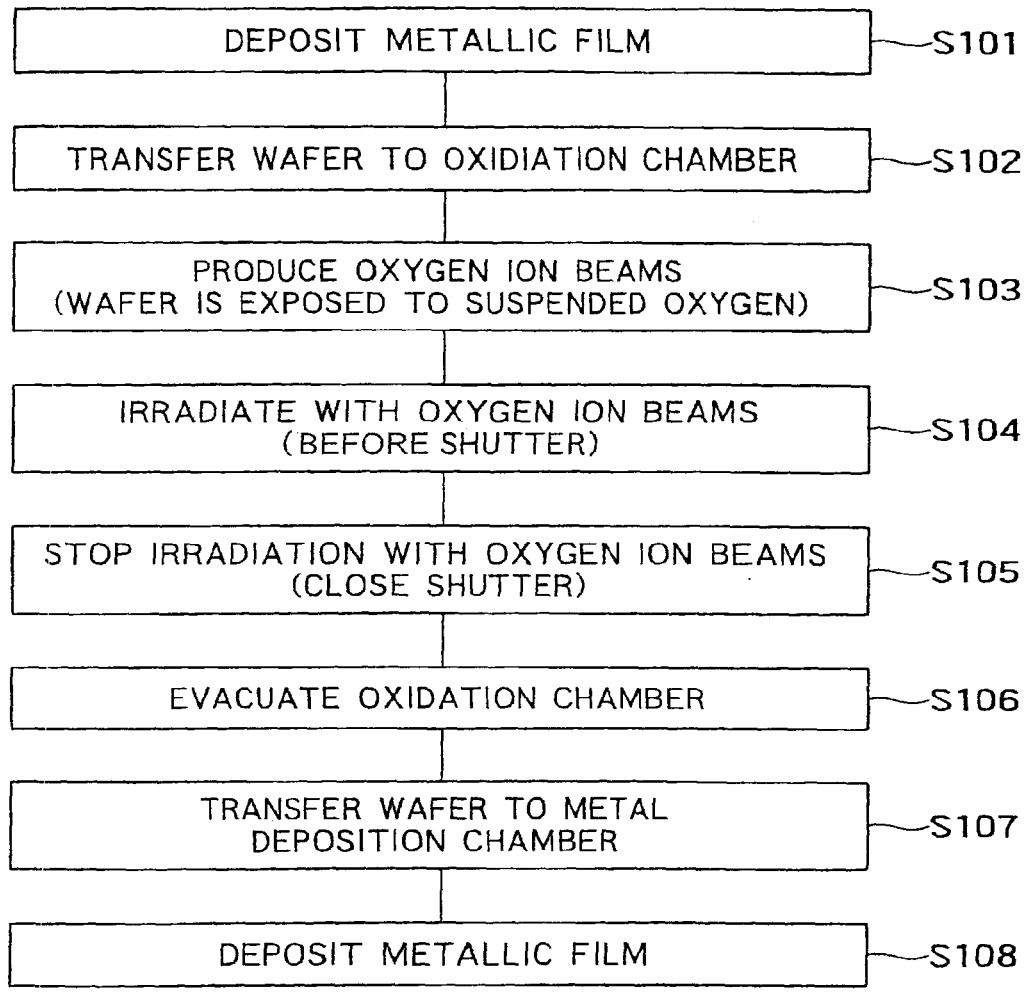
FIG. 4 is a flow chart showing a sequence of an oxidizing process and processes before and after the oxidizing processes, which was carried out by the inventors as a comparative example to the present invention.

FIG. 4 is a flow chart showing a sequence of an oxidizing process and processes before and after the oxidizing processes, which was carried out by the inventors as a comparative example to an aspect of the present invention.

First, referring to FIG. 4, the oxidizing process in the comparative example will be described below.

First, at step S101 in the oxidizing process in the comparative example, a metal film is deposited in the metal deposition chamber by the PVD method or the IBD method.

Then, at step S102, a wafer is transferred to the oxidizing chamber.

Then, at step S103, oxygen containing ion beams are allowed to be struck. Specifically, oxygen containing gas is fed to the ion source 108D via the ion source gas supply system 108F to produce plasma in the ion source 108D to be stabilized. The gas fed at this time may be only oxygen, or a mixed gas of oxygen and argon or xenon.

At this step, the wafer mounted on the holder 108B is covered with the shutter 108C, so that the surface of the wafer is not irradiated with an oxygen ion beam emitted from the ion source 108D. However, oxygen gas leaking out of the ion source 108D passes through the surrounding of the shutter 108C to reach the wafer. That is, even if the shutter 108C is closed, the wafer is exposed to oxygen gas. As a result, a natural oxide film is formed on the surface of the wafer.

Then, at step S104, the wafer is irradiated with an oxygen ion beam. Specifically, the shutter 108C is open in a state that the ion beam of the ion source 108D is stable on predetermined conditions. By the irradiation with the oxygen ion beam, the surface of the wafer is oxidized, so that an oxide film is formed thereon.

After the ion irradiation is carried out for a predetermined period of time, the shutter 108C is closed at step S105 to stop the formation of the oxide film.

Then, at step S106, the oxidizing chamber 108 is evacuated to the same degree of vacuum as that in a state that no process gas exists.

Thereafter, at step S107, the wafer is transferred to the metal deposition chamber for the PVD or IBD, and at step S108, an upper metal layer of CoFe/Cu/CoFeNi/Cu is deposited.

As described above, in the process in the comparative example, the oxygen containing gas is supplied to the ion source 108D at step S103. At this time, suspended oxygen leaking out of the ion source 108D reaches the surface of the wafer via the surrounding of the shutter 108C to form a natural oxide film.

On the other hand, according to the process of one aspect of the present invention illustrated in FIG. 3, it is possible to prevent the production of such "suspended oxygen".

The process of FIG. 3 is as follows.

First, at step S1, a metal film is deposited in the metal deposition chamber by the PVD method or the IBD method.

Then, at step S2, the wafer is transferred to the oxidizing chamber.

Then, at step S3, an argon ion beam is allowed to be struck. Specifically, argon is fed to the ion source 108D via the ion source gas supply system 108F to produce plasma in the ion source 108D to be stabilized. At this time, the wafer mounted on the holder 108B is covered with the shutter 108C, so that the surface of the wafer is not irradiated with the argon ion beam emitted from the ion source 108D. However, the wafer is exposed to argon gas which passes through the surrounding of the shutter 108C to reach the wafer. However, at this stage, oxygen is not supplied, so that the wafer is not exposed to suspended oxygen.

If oxygen ion beams are intended to be first produced as the conventional IBO process illustrated in FIG. 4, the surface of the wafer is exposed to suspended oxygen to form a natural oxide film before plasma is produced to prepare strike whether it is diluted with argon or not. On the other hand, according to the present invention, there is not such a problem since oxygen is not used as a gas for an ion beam at the initial stage that plasma is produced. While oxygen has been used in this embodiment, this is the same if nitrogen gas is used for forming a nitrogen gas.

After argon ion beams are stable on predetermined conditions, the shutter 108C is open at step S4, and before and after this, oxygen gas is fed to the oxidizing chamber 108 from the oxygen gas feed system 108E. It is important that the timing in opening the shutter is substantially simultaneous with the timing in feeding oxygen. It is required for both timings to be completely simultaneous with each other. However, when the feeding of oxygen carried out is in advance or when the opening of the shutter is carried out in advance, the time interval therebetween is not preferably 1 minute or more. This interval is more preferably 30 seconds or less, and most preferably 15 seconds or less. The gas line 108K shown in FIG. 2 may be used for feeding oxygen gas to the ion source. If the sequence according to the first embodiment of the present invention is used for the timing in feeding oxygen, the advantages of the present invention are provided as a new IBO unlike the conventional IBO. The details thereof will be described in the second embodiment which will be described later.

According to the first embodiment of the present invention, it is possible to precisely control the amount of oxygen to be fed, and it is also possible to obtain the "assist effect" for improving the quality of the oxide film, by applying appropriate energy by the irradiation with argon ions. These effects can be independently balanced with high controllability. It is considered that the "assist effect" based on the irradiation with argon ions according to the first embodiment of the present invention also has the function of promoting the dissociation into oxygen atom from oxygen molecule which is fed as a simple molecular gas, and the ionization and radicalization thereof. By these effects, it is possible to control the oxidation reaction on the surface of the wafer to obtain a high quality oxide film with high controllability.

Desired conditions on ion beams used at step S4 are shown in Table 1.

TABLE 1

| Conditions On Ion Beams | |
|---|---|
| Beam Energy | 50~150 eV |
| Beam Current | 0.1~1 mA/inch$^2$ |
| Metal Etching Rate | 1~10 A/min |
| Irradiation Time | 5 seconds~5 minutes |

The above described beam current is a current quantity of an accelerating grid per a unit area of a square inch. That is, the above described conditions on ion beams are very important to obtain an NOL having good characteristics according to the present invention. In particular, beam energy, i.e., the accelerating voltage is important.

Figure 5:
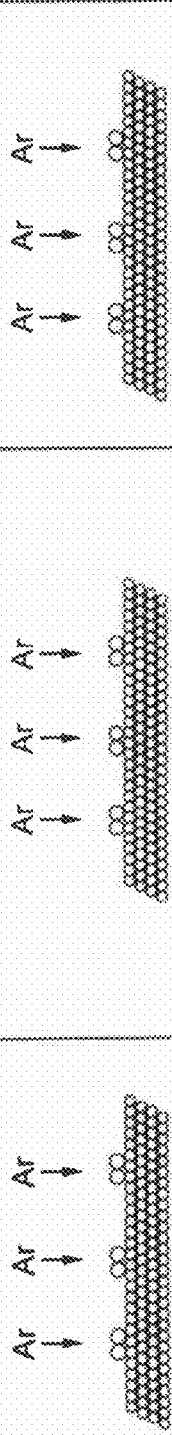
FIG. 5 is an illustration conceptually showing a difference in NOL forming mechanism when an accelerating energy is varied.

FIG. 5 is an illustration conceptually showing a difference in NOL forming mechanism when an accelerating energy is varied.

As illustrated in FIG. 5(a), when the accelerating energy is low, the irradiation with argon ions has only an effect to such an extent that oxygen absorbed by the flow of oxygen is desorbed, and can not apply energy to such an extent that a good oxide film is formed. At this time, the energy of argon ions is in such a range that the surface of the metal is hardly etched.

As illustrated in FIG. 5(b), when the accelerating energy is appropriately high, it is not only possible to desorb oxygen having a weak reactivity absorbed into the surface of the film by the flow of oxygen, but it is also possible to etch the surface of the base metal on the surface of the film, in which an NOL is to be formed, to dissociate the metal atom-to-metal atom bonds, so that it is possible to improve the reactivity with oxygen. That is, if the feed rate of oxygen is larger than the etching rate of the metal, a high quality oxide film is formed on the surface of the film. Of course, the argon ion beam at this time does not only have the function of cutting the metallic bonds on the surface of the metal to improve the reactivity, but they also function as an energy assist source when oxidation is carried out. As a result, a strongly combined oxygen film containing no undesired oxygen is formed.

This optimum range of ion accelerating energy is the range of from about 50 to 150 eV, preferably the range of from 80 to 120 eV. In this case, the etching rate of the metal is in the range of from 1 to 10 Å/min.

If the accelerating energy is higher than this range, the etching rate of the metal is insufficient with respect to the supply of oxygen, so that an oxide film is not formed. In addition, damage to the surface of the base metal thin film increases. Therefore, this is not desired.

The argon ion irradiation time is preferably in the range of from about 5 seconds to about 5 minutes. If it is shorter than this range, there is no effect of ion irradiation, and if it is longer than this range, it is not possible to ignore damage to the underlying layer. For this reason, the ion irradiation time is preferably in the range of from 5 seconds to 3 minutes, and more preferably in the range of from 10 seconds to 1 minute.

In this embodiment, the accelerating energy was 100 eV, the plasma RF power was 50 W, the positive accelerating grid current was 15 mA, and the ion irradiation time was 20 seconds. By this process, the base metal FeCo film is oxidized to be an NOL. The features of the NOL obtained according to the present invention will be described in detail with respect to the subsequent embodiment.

The integrated value of the feed rate of oxygen was a very small amount of oxygen. Although the Langmuir conversion (1 L=1×10$^{-6}$ Torr·sec) can not be precisely carried out since argon gas has been already fed to the oxidizing chamber 108, a total amount of about 400 L of oxygen was used as the amount of oxygen measured in a high vacuum state that no argon gas is fed. In the film with such a construction in this embodiment, if the Langmuir is lower than the above described amount, the magnetic coupling of the upper and lower pinned layers via the NOL is good, but the specularity is not sufficient. If a larger amount of oxygen than the above described amount is fed, the magnetic coupling of the upper and lower pinned layers via the NOL is not the ferro coupling. This is no good.

This optimum amount of oxygen does not only depend on the base metal material which is to be an NOL, but it also varies in accordance with the construction of the film underlying the NOL, so that it is not uniform. However, as one reference, the amount of oxygen is preferably is 1000 L or less when the magnetic coupling is caused by the thin NOL in the high energy process according to the present invention. When natural oxidation is carried out, if the size of the oxidizing chamber 108 is small and if the oxygen flow method is devised to some extent, such a small amount of oxygen can be controlled. However, in the conventional IBO technique for feeding oxygen gas from the initial state that plasma is produced in the ion source, the amount of oxygen is such a level that there is some possibility that the sample has been already exposed in timing with the preparation of plasma.

On the other hand, according to the first embodiment of the present invention, it is possible to cope with both a low-level amount of oxygen and a high energy process although this was conventionally difficult. Furthermore, the process sequence according to the first embodiment of the present invention particularly has conspicuous effects when the amount of oxygen is small. However, the application of the process sequence according to the first embodiment of the present invention should not be limited to a case where the amount of oxygen is small, but it can be applied to a case where the amount of oxygen is relatively high level. In particular, when a base metal material which is difficult to form a stable oxide is used, an NOL having a far better quality than that of a natural oxide layer which can not apply energy can be formed according to the present invention.

The step S4 of FIG. 3 has been described above in detail.

After the flow of oxygen and the ion irradiation are thus carried out for a predetermined period of time, the shutter 108C is closed and the supply of oxygen gas is stopped at step S5. At this time, it is not so preferred that the supply of oxygen gas is stopped after the shutter 108C is closed. Because oxygen which may be suspended oxygen, to which no energy is applied, remains on the surface. The supply of oxygen gas is stopped preferably within at least 30 seconds, and more preferably within 15 seconds, after the shutter is closed.

Inversely, there are some cases where it is desired that the supply of oxygen gas is stopped before the shutter is closed. Because the surface can be flattened by desorbing undesired oxygen and simultaneously carrying out the irradiation with ions at a low energy. In this case, if the ion accelerating voltage is not varied, the ion irradiation is carried out within 1 minute, and even if the accelerating voltage is varied, the ion irradiation is carried out within 5 minutes. However, in order to remove the influence of undesired milling, the ion irradiation is preferably carried out within 15 seconds.

After the oxidizing process is thus completed, the supply of argon gas is stopped, and all of the plasma power and so forth are stopped to evacuate the oxidizing chamber 108 by means of the exhaust pump 108A to the same pressure as the degree of vacuum in a state that no process gas exists, at step S6.

Thereafter, at step S7, the wafer is transferred to the metal deposition chamber 110 or 112 of the PVD or IBD system, and at step S8, an upper metal layer of CoFe/Cu/CoFeNi/Cu is deposited. At this time, the lower CoFe layer (pinned layer ②) is magnetically coupled to the CoFe pinned layer (pinned layer ①) which contacts PtMn via the NOL. In this construction, the upper and lower pinned layers arranged on both sides of the NOL are ferromagnetically coupled. However, by changing the material and the thickness of the NOL, the upper and lower pinned layers can be antiferromagnetically coupled. From the standpoints of the high specularity and the high magnetic bond, the thickness of the NOL is preferably in the range of from 1 to 3 nm.

Since the magnetized amount of the pinned layers increases when the pinned layers are ferromagnetically coupled, this can not be applied to a head as it is from the standpoint of the control of the bias point, so that the synthetic anti-ferri structure can be taken. That is, such a structure as PtMn/CoFe↓/Ru/CoFe↑/NOL/CoFe↑/ . . . (↑ denotes a magnetized direction) must be provided to substantially reduce the magnetized amount in the whole pinned layer.

On the other hand, when the pinned layers are antiferromagnetically coupled via the NOL, it is not required to provide the synthetic structure using Ru. There are some cases where an additional element is added to the CoFe layer (pinned layer ②) which is deposited on the NOL. In addition, Cr, B, C, Si, Al or the like may be added. The thickness thereof is preferably in the range of from about 1 nm to about 5 nm. In particular, in the CIP type which will be described later, the thickness is preferably in the range of from 1 nm to 3 nm. The reason for this is that although the thickness is preferably small in order to provide a bias point and a low shunt film, the rate of change in MR is low if the thickness is too small. However, according to the first embodiment of the present invention, an NOL having a good specularity can be formed, so that a high rate of change in MR can be realized with a small thickness of 1 to 2 nm. Furthermore, the thickness of the spacer Cu layer (non-magnetic intermediate layer) formed thereon is preferably in the range of from about 1.8 nm to about 2.5 nm.

The reason why CoFeNi is used as the free layer is that it is possible to a higher rate of change in MR than that of a CoFe/NiFe stacked free layer. By adding a very small amount of Ni to CoFe, it is possible to realize a lower magneto striction and a lower Hc than those of pure CoFe. The Cu layer on the free layer is a high conductive layer (which will be also hereinafter referred to as a spin filter Cu layer) required for the bias point, and can reduce the magnetic field due to current applied to the free layer. The thickness thereof is preferably in the range of from about 0.3 nm to about 3 nm. In the CIP type, the thickness is preferably 1 nm or less since the low shunt is provided. The total thickness of the spin filter Cu layer and the above described free layer is preferably in the range of from 2 nm to 4 nm.

The TaO layer on the Cu layer (high conductive layer) is a specular reflective layer on the side of the free layer. That is, this layer has the function of reflecting electrons. This is formed by oxidizing a Ta film using the oxidizing chamber 108 similar to the pinned layer NOL after depositing the Ta film serving as a base metal in the metal deposition chamber (the PVD chamber or IBD chamber). The sequence of the oxidizing process can be the same as that in the case of the pinned layer NOL. However, since there are some cases where it is difficult to oxidize the inside of the film in the thickness direction by the process from the surface in the case of Ta, the deposition of the metal layer and oxidation based on the IAO may be repeated a plurality of times. The optimum conditions on the IAO are substantially the same as the conditions shown in Table 1. With respect to the NOL on the side of the free layer, it is not always required to use the IAO. A TaO layer may be directly deposited as an oxide by the IBD, or it may be deposited by the reactive sputtering. Alternatively, any one of aluminum oxides or iron oxides, not TaO, may be used. An oxide containing a base metal of the same FeCo as that used on the side of the pinned layer may be used. Moreover, the unique materials of the NOL on the side of the free layer, which are shown in the advanced sixth through eighth embodiments which will be described later, may be used.

After forming the TaO layer which is to be an NOL on the side of the free layer, a Ta layer (protective cap layer) is deposited in the metal deposition chamber (the PVD chamber or IBD chamber). Although this layer preferably exists, it is not always required to deposit this layer if there is no problem in process.

Figure 16:
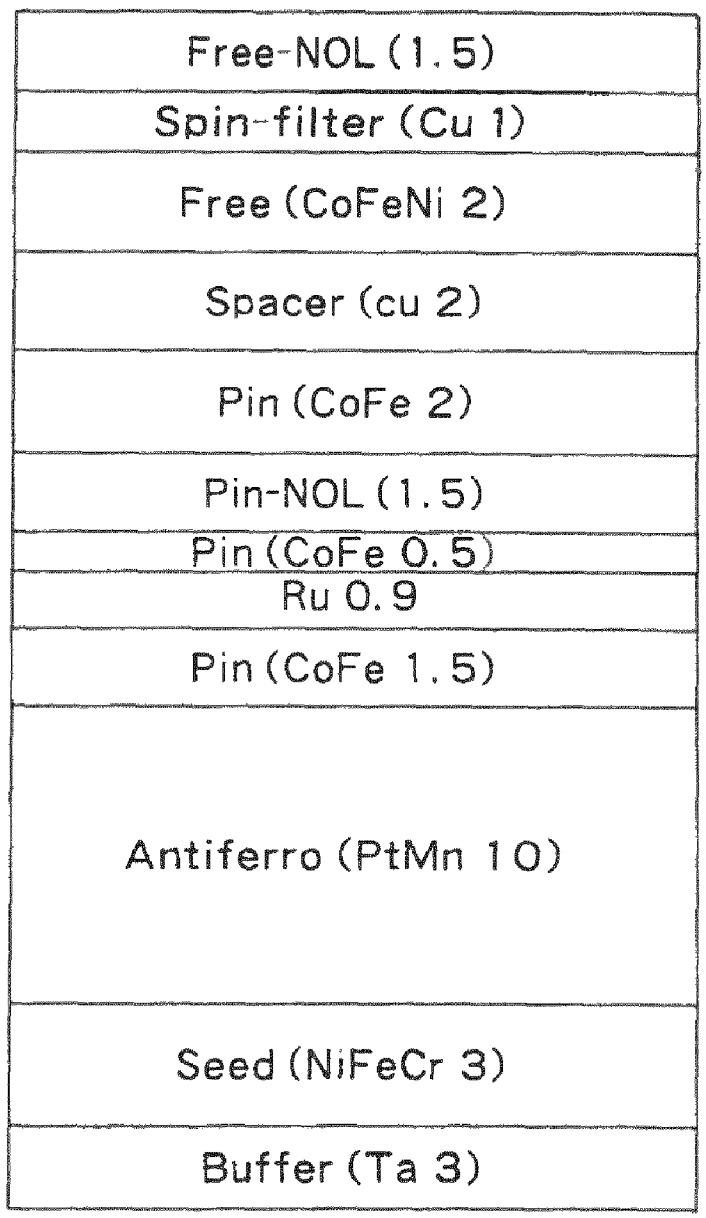
FIG. 16 is a schematic diagram showing the construction of a CIP type spin-valve film having a synthetic anti-ferri structure described in the first embodiment of the present invention.

As described above, the Sy-AF structure is preferably adopted when this is applied to an actual head. As an example of its concrete structure, there is the following stacked structure. A spin-valve film having this stacked structure is shown in FIG. 16. In this figure, numerals added to the respective layers denote the thickness values (nm) thereof. Furthermore, the spin-valve film having this stacked structure is a CIP (Current In Plane) type in which a current is applied in a direction parallel to the surface of the film.

Substrate/Ta 3/NiFeCr 3/PtMn 10/CoFe 1.5/Ru 0.9/CoFe 0.5/NOL-pin 1.5/CoFe 2/Cu 2/CoFeNi 2/Cu 1/NOL-free 1.5/Ta 1

Figure 17:
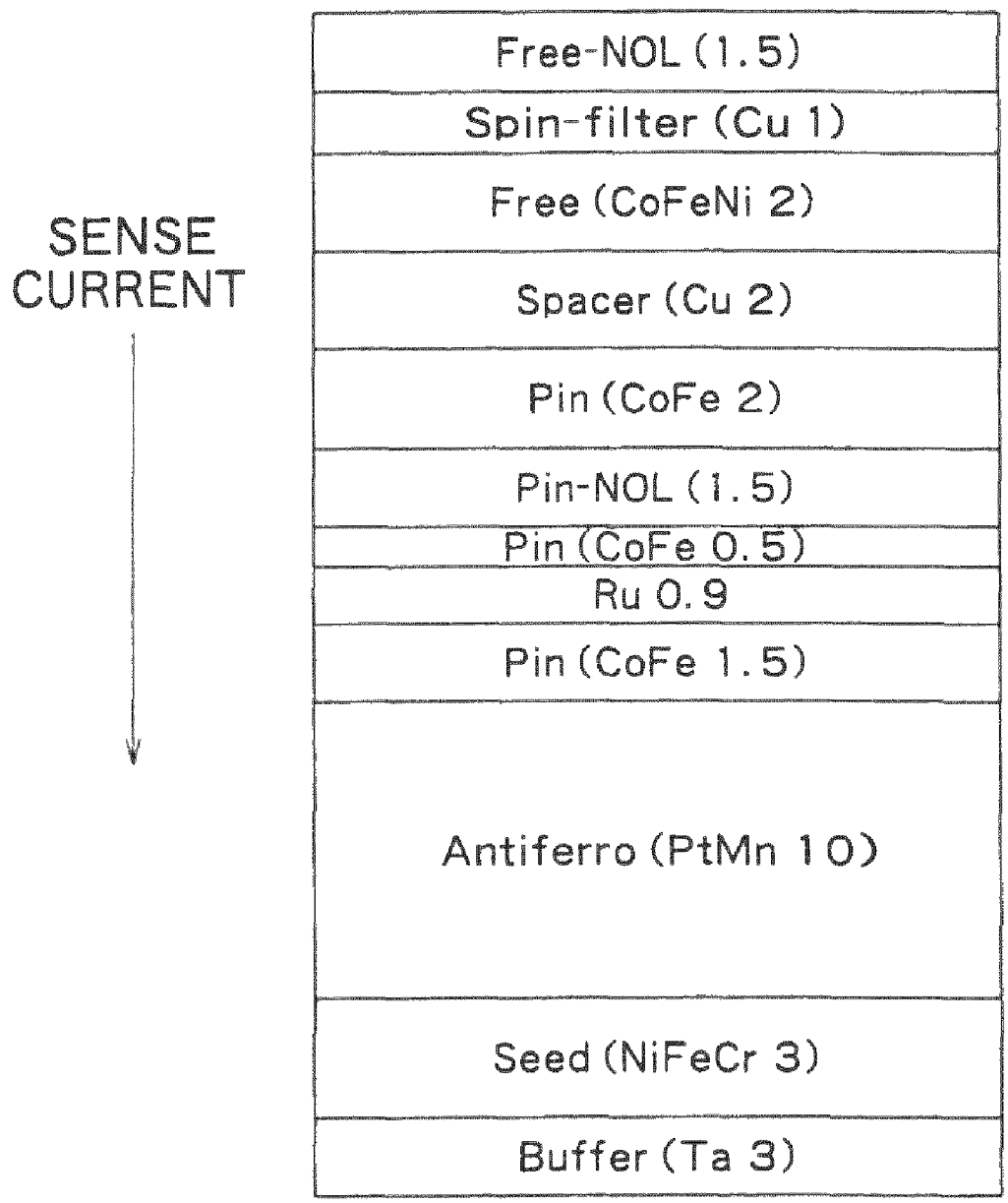
FIG. 17 is a schematic diagram showing the construction of a CPP type spin-valve film having a synthetic anti-ferri structure described in the first embodiment of the present invention.

For example, the NOL-pin is an FeCo oxide, and NOL-free is a Ta oxide. The thickness of CoFeNi which is to be a free layer is preferably in the range of from 1.5 to 2.5 nm. The free layer may be a stacked free layer of CoFe 1/NiFe 1. The materials of other layers may be other materials which have been described above. There are some cases where the CoFe 0.5 nm between Ru and NOL is hardly distinguished since it is actually oxidized. Since the functions of the respective layers are not changed as described above even if the Sy-AF structure is adopted, the foregoing is not essentially changed. In addition, the spin-valve film having the Sy-AF structure may be a CPP (Current perpendicular to Plane) type shown in FIG. 17, in which a current is applied in a direction perpendicular to the surface of the film, not the CIP type shown in FIG. 16.

Moreover, the above described construction is a so-called "bottom type" spin-valve film wherein an antiferromagnetic film is arranged below a free layer. However, it may be inversely a "top type" spin-valve film. Also in that case, both of the monolayer pin structure and the Sy-AF structure are basically the same as those in this embodiment.

Specifically, in the case of the monolayer pin structure, there is the following stacked structure.

Substrate/Ta 3/NiFeCr 3/NOL-free 1.5/Cu 1/CoFeNi 2/Cu 2/CoFe 2/NOL-pin 1.5/CoFe 1/PtMn 10/Ta 3

In the case of the Sy-AF structure, there is the following stacked structure.

Substrate/Ta 3/NiFeCr 3/NOL-free 1.5/Cu 1/CoFeNi 2/Cu 2/CoFe 2/NOL-pin 1.5/CoFe 0.5/Ru 0.9/CoFe 1.5/PtMn 10/Ta 3

Also in the above described constructions, numerals of the respective layers denote thickness values (nm). The materials of the respective layers are basically the same as those in the case of the bottom type.

Second Embodiment

The second embodiment of the present invention will be described below. This embodiment relates to a process sequence when oxygen is fed to an ion source in an oxidizing chamber.

Figure 6:
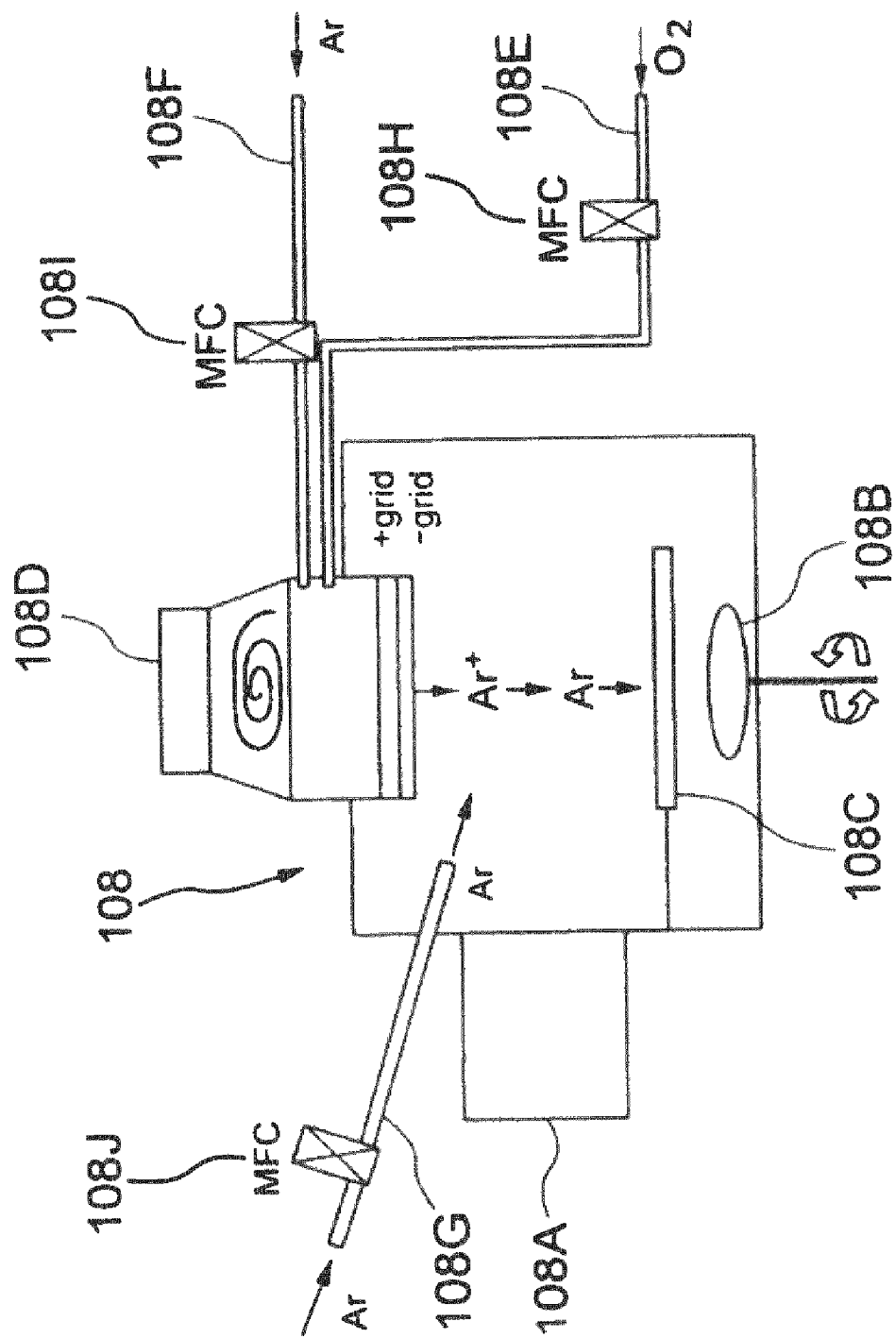
FIG. 6 is a conceptual drawing showing the construction of an oxidizing chamber capable of being used in the second embodiment of the present invention.

FIG. 6 is a conceptual drawing showing the construction of an oxidizing chamber capable of being used in this embodiment.

Figure 7:
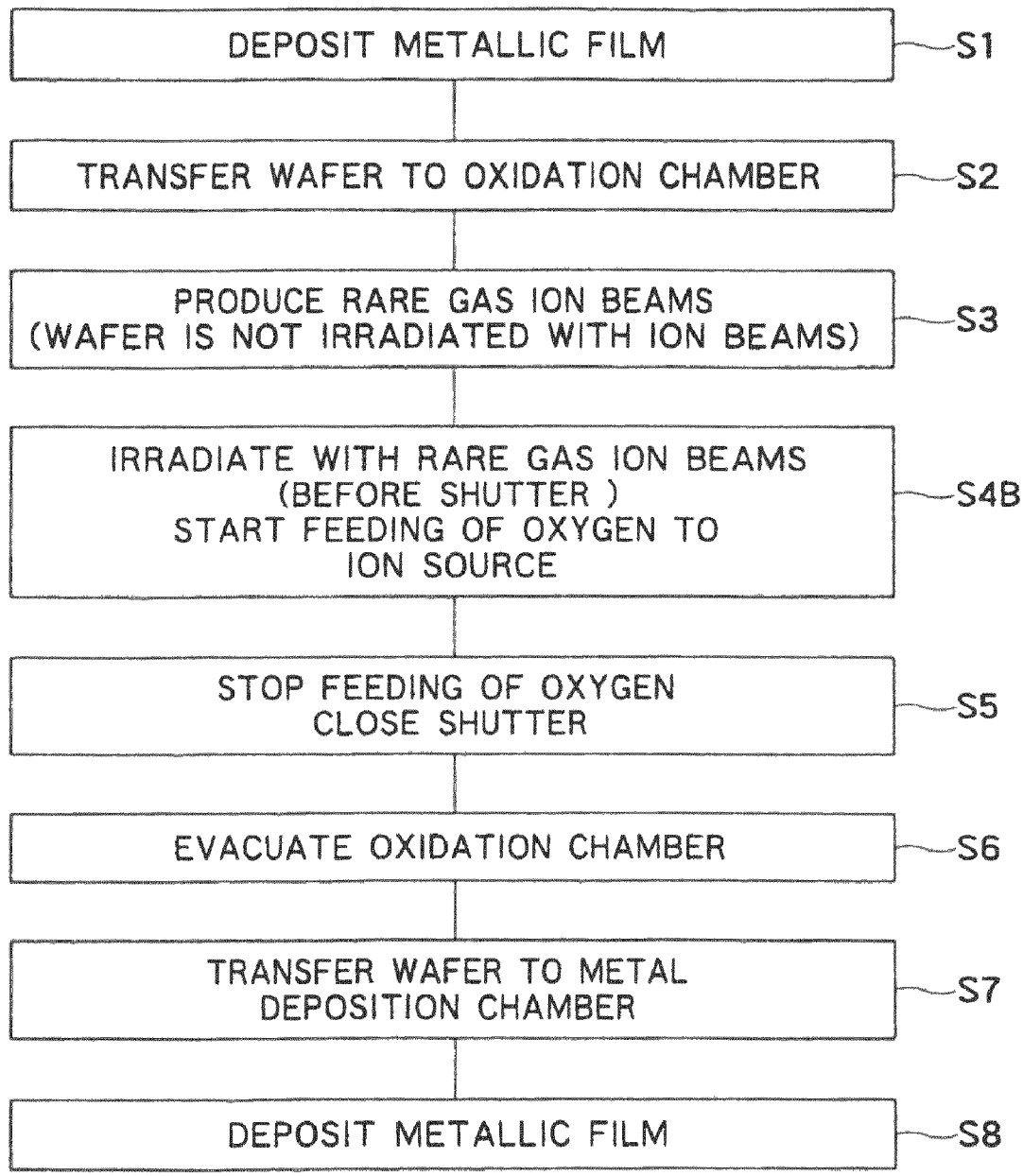
FIG. 7 is a flow chart showing a sequence of an oxidizing process which is carried out by using the oxidizing chamber of FIG. 6.

FIG. 7 is a flow chart showing a sequence of an oxidizing process which is carried out by using the oxidizing chamber of FIG. 6.

In FIGS. 6 and 7, the same reference numbers are given to the same elements as those which have been described above with respect to FIGS. 2 through 4, and the detailed descriptions are omitted.

As shown in FIG. 6, in the oxidizing chamber 108 in this embodiment, the oxygen feed system 108E is connected to the ion source 108, so that oxygen containing ions can be produced.

When such an oxidizing chamber 108 is used for carrying out the conventional IBO method, it is a first object to irradiate with oxygen plasma, so that the substrate is irradiated with oxygen ions after oxygen plasma is stabilized. For that reason, oxygen gas caused to flow before the stabilization of the plasma leaks into the oxidizing chamber to function as suspended oxygen.

On the other hand, in this embodiment, it is possible to carry out the IAO while inhibiting the production of suspended oxygen, by adjusting the timing in opening the shutter 108C and the timing in supplying the gas to the ion source.

Specifically, the sequence of the IAO illustrated in FIG. 7 may be used. That is, after a rare gas ion plasma is produced at step S3, oxygen gas may be fed to the ion source 108D via the gas line 108K substantially simultaneously with the irradiation with rare gas ions at step S4.

According to an aspect of the present invention, it is most important to prevent suspended oxygen from being fed into the oxidizing chamber in a state that no energy assist exists. At step S4B, the ion irradiation and the feeding of oxygen are substantially simultaneously carried out, and their timings are the same as a case where oxygen gas is fed directly to the oxidizing chamber at step S4 in the first embodiment. A case where nitrogen gas is used in place of oxygen gas is also the same.

Also in this embodiment, it is possible to feed a very small amount of oxygen gas with high controllability, and it is also possible to obtain the "assist effect" of rare gas ions. In addition, it is possible to surely inhibit a natural oxide film from being produced by suspended oxygen.

The process according to an aspect of the present invention which does not form the initial natural oxide film can be applied to radical oxidation (or nitriding).

Also in the case of radical oxidation similar to the irradiation with oxygen ion beams, it is required to initially produce plasma in order to irradiate with radicals. However, in radical oxidation carried out by the conventional technique, oxygen (nitrogen in the case of nitriding) is fed to the radical plasma source from the initial stage in which plasma is produced, so that oxygen gas fed to the radical plasma source before the stabilization of plasma leaks into the chamber to reach the surface of the film to form a dirty natural oxide layer. If a fabricating sequence according to the present invention is used, it is possible to eliminate the influence of the dirty natural oxide film.

Specifically, in the stage that plasma is initially produced in the radical source, oxygen gas is not supplied to the radical source, and only the rare gas such as argon is supplied thereto. After this process, when oxygen gas reaches the surface of the film by feeding any one of oxygen and nitrogen gases to the radical plasma source in which plasma has been produced, oxygen can be supplied in a high reactivity radical state from the initial stage, so that it is possible to eliminate the influence of the dirty natural oxide film (or natural nitride film).

After it is verified that the production of the rare gas plasma is sufficiently stable, any one of oxygen and nitrogen gases is preferably fed. By this process, it is possible to form a high quality oxide film (nitride film).

Third Embodiment

The third embodiment of the present invention will be described below. This embodiment relates to a process sequence when oxygen is fed in an oxidizing chamber having no independent ion source.

Figure 8:
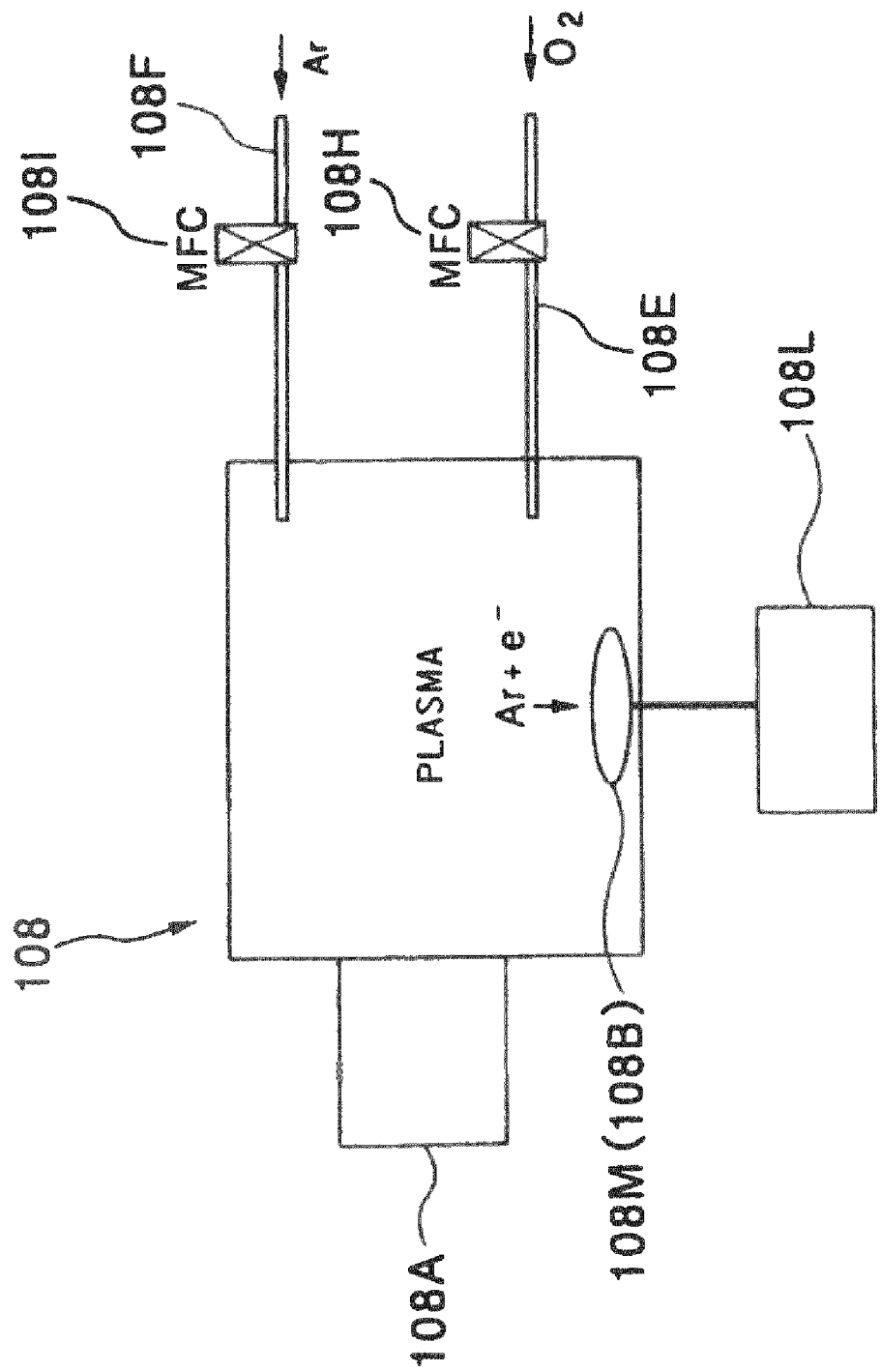
FIG. 8 is a conceptual drawing showing the construction of an oxidizing chamber capable of being used in the third embodiment of the present invention.

FIG. 8 is a conceptual drawing showing the construction of an oxidizing chamber capable of being used in this embodiment.

Figure 9:
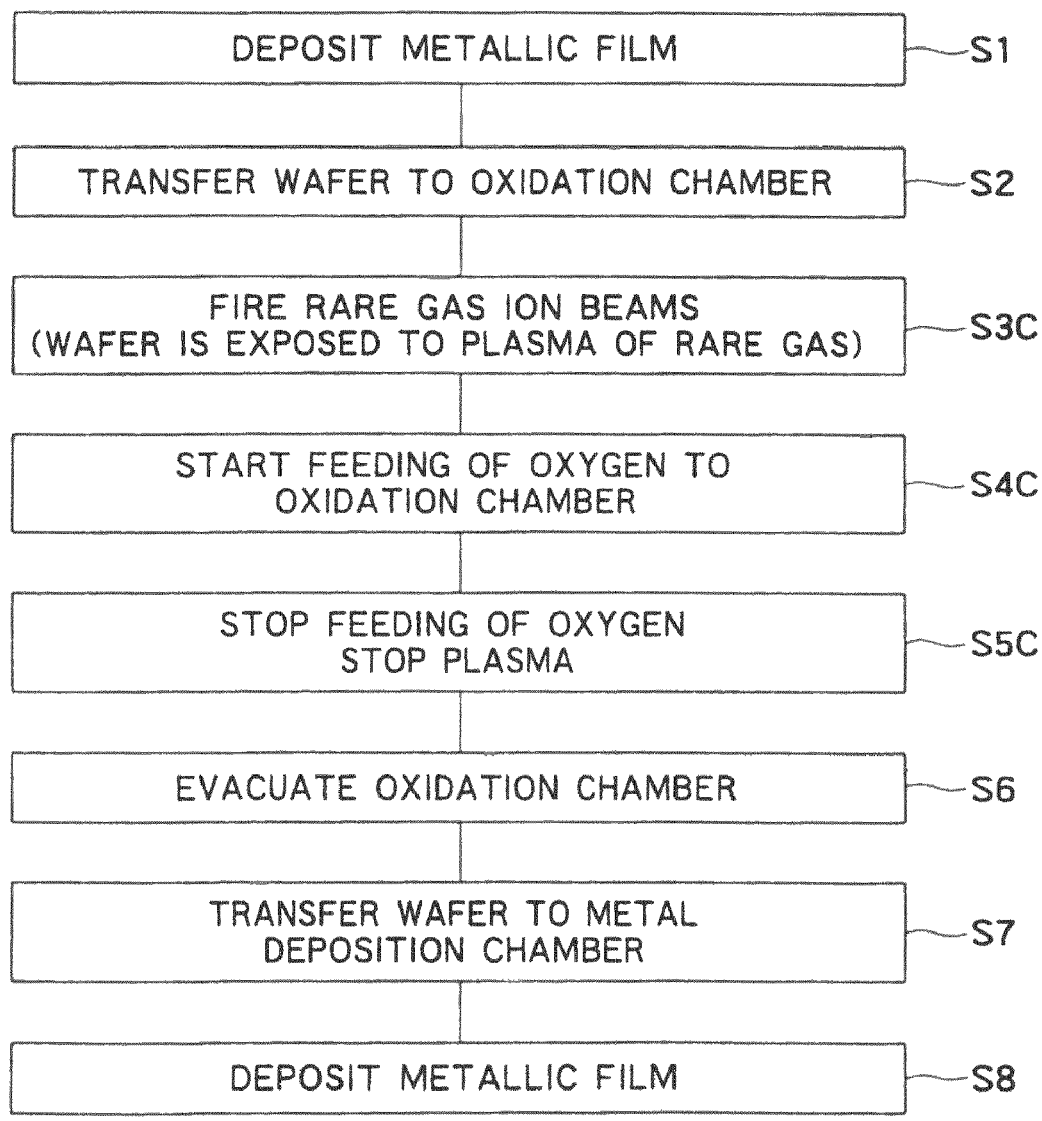
FIG. 9 is a flow chart showing a sequence of an oxidizing process which is carried out by using the oxidizing chamber of FIG. 8.

FIG. 9 is a flow chart showing a sequence of an oxidizing process which is carried out by using the oxidizing chamber of FIG. 8.

In FIGS. 8 and 9, the same reference numbers are given to the same elements as those which have been described above with respect to FIGS. 2 through 7, and the detailed descriptions are omitted.

As shown in FIG. 8, the oxidizing chamber 108 in this embodiment has no independent ion source. In place thereof, plasma is produced in the oxidizing chamber by means of a plasma producing electrode 108M which is connected to a plasma producing power supply 108L. The oxidizing chamber 108 is connected to an oxygen feed system 108E and a rare gas feed system 108G, so that plasma containing a rare gas can be produced.

When such an oxidizing chamber 108 is used for carrying out the conventional plasma oxidizing method, the production of plasma is started after oxygen is fed to the oxidizing chamber 108 since it is a first object to irradiate with oxygen plasma. For that reason, oxygen gas caused to flow before the stabilization of the plasma leaks into the oxidizing chamber to function as suspended oxygen.

On the other hand, in this embodiment, it is possible to carry out the IAO while inhibiting the production of suspended oxygen, by adjusting the timing in feeding oxygen.

Specifically, the sequence of the IAO illustrated in FIG. 9 may be used. In the IAO process, it is not an object to produce the plasma of oxygen to carry out ion irradiation, and rare gas ions serve as an energy source. Therefore, first, at step S3C, a rare gas is fed from the feed system 108G to produce plasma. At this time, oxygen is not yet fed. Then, after rare gas plasma is produced, oxygen gas is fed to the oxidizing chamber 108 at step S4C.

In this case, in fact, there is some possibility that oxygen plasma is not stable the instant oxygen gas is fed to the oxidizing chamber. However, in the IAO method according to an aspect of the present invention, there is no problem since it is not essential to supply oxygen as plasma ions. It is most important to prevent suspended oxygen from being fed into the oxidizing chamber in a state that no energy assist exists.

That is, in this embodiment, the plasma of a rare gas is produced by a very weak power, and in this state, oxygen gas is fed to the substrate to oxidize it. When oxygen is fed, it does not matter whether the plasma of oxygen is produced or not. Therefore, it is not required to a large amount of oxygen to the oxidizing chamber in order to produce the plasma of oxygen.

In general, when plasma is fired, it is required to instantaneously fed a large amount of gas to raise pressure. However, in this embodiment, the rare gas is instantaneously fed to produce plasma, and oxygen gas may be fed substantially simultaneously with the firing of the rare gas plasma. The timing in firing the rare gas plasma is preferably substantially simultaneous with the timing in feeding oxygen gas, and these timings are the same as those in the first and second embodiment.

This process can be similarly carried out when nitrogen gas or the like is caused to flow in place of oxygen gas to form a nitride film or the like.

Fourth Embodiment

The fourth embodiment of the present invention will be described below. This embodiment relates to a feeding method capable of uniformly feeding oxygen gas to an oxidizing chamber, and can be applied to the above described first or third embodiment.

Figure 10:
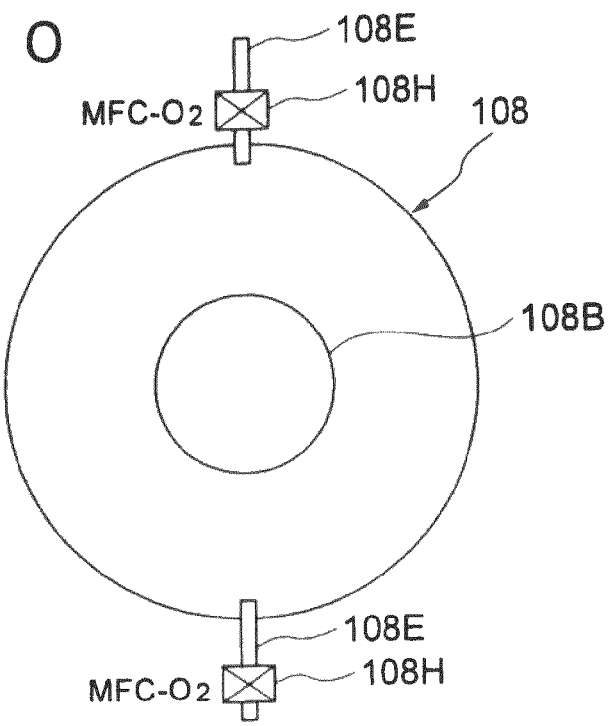
FIG. 10 is a conceptual drawing showing an example of the construction of an oxygen introducing system in the fourth embodiment of the present invention.
Figure 11:
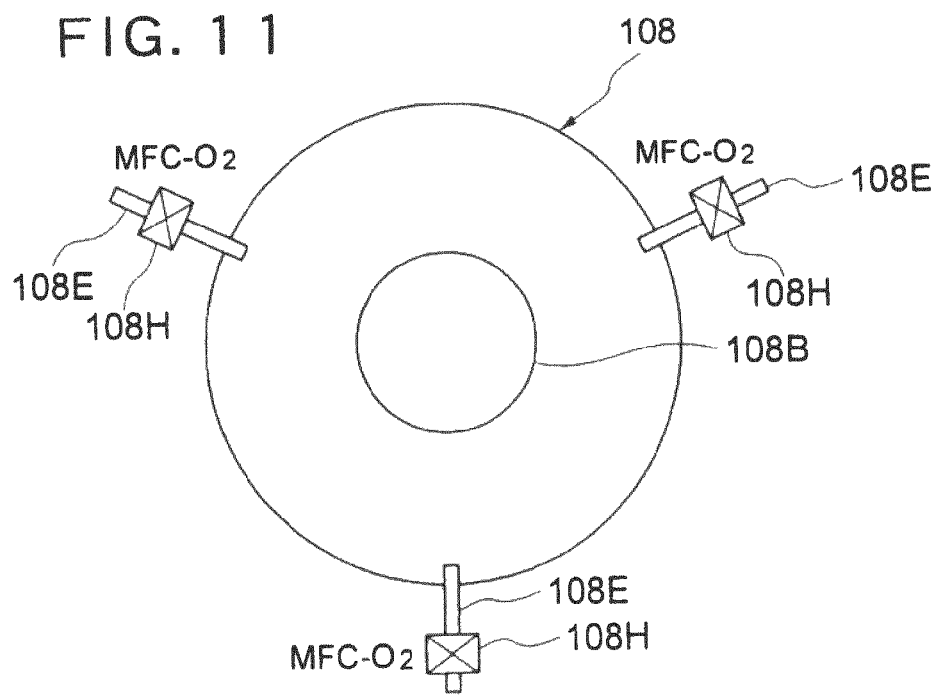
FIG. 11 is a conceptual drawing showing an example of the construction of an oxygen introducing system in the fourth embodiment of the present invention.
Figure 12:
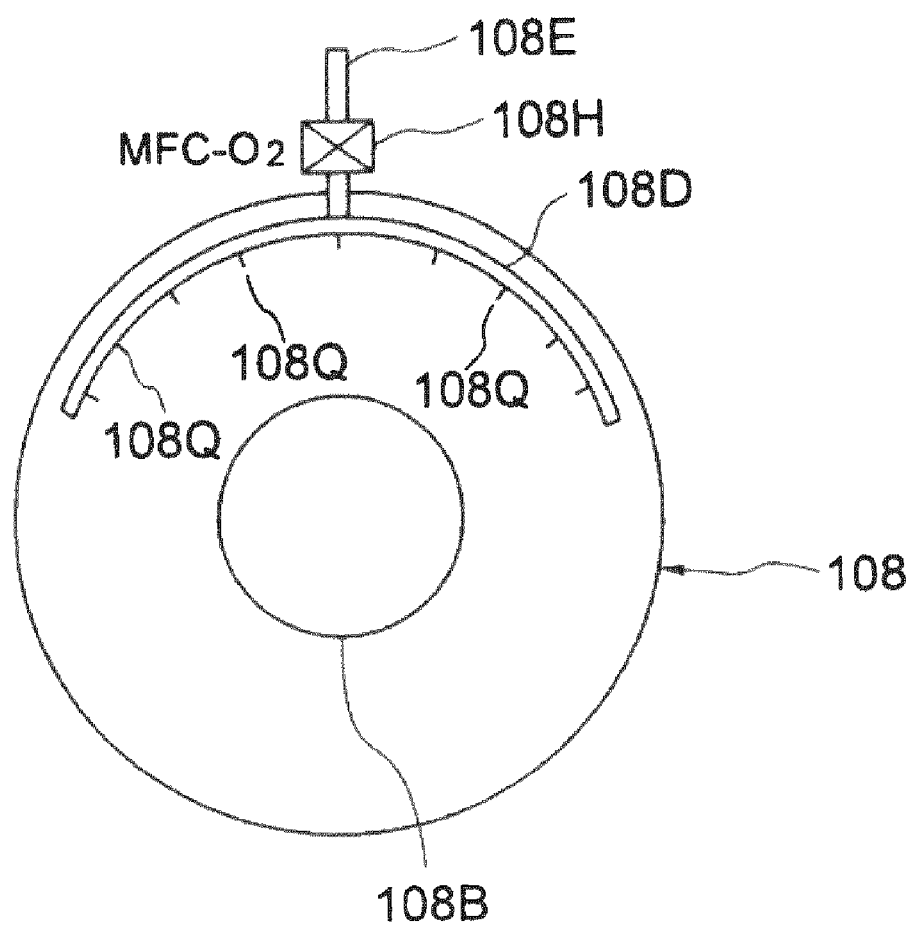
FIG. 12 is a conceptual drawing showing an example of the construction of an oxygen introducing system in the fourth embodiment of the present invention.

FIGS. 10 through 12 are conceptual drawings showing an example of the construction of an oxygen feeding system in this embodiment.

In an aspect of the present invention, one point is that an NOL is formed by a small amount of oxygen. In the case of such a small amount of oxygen, it is required to devise a method for causing the flow of oxygen. First, the size of the oxidizing chamber 108 is preferably as small as possible, and the time required for oxygen to diffuse in the whole oxidizing chamber after the feeding of oxygen is preferably short.

Moreover, there are some cases where it is required to devise a technique for feeding oxygen. In the case of a small amount of oxygen, the proportion of the time required for oxygen to diffuse in the whole oxidizing chamber in the total time in which oxygen flows is large. For that reason, in the time required for oxygen to diffuse after the feeding of oxygen, it is required to devise so that the distribution of the amount of oxygen is not caused in the wafer.

On the other hand, in an example shown in FIG. 10, two oxygen feed systems 108E are provided. By thus feeding oxygen from two or more feed systems 108E, it is possible to reduce the distribution of the amount of oxygen in the wafer in a transitional state in which oxygen diffuses in the oxidizing chamber. Furthermore, it is not required to provide a separate flow control means 108H in each of the oxygen feed systems 108E, and a plurality of feed systems branching from a common flow control means may be connected to the oxidizing chamber 108.

In an example shown in FIG. 11, three oxygen feed systems are provided. Thus, oxygen can more uniformly diffuse in the oxidizing chamber. Of course, in addition to the shown example, oxygen may be fed from four, five, six or more pipes.

On the other hand, FIG. 12 is a conceptual drawing showing an example where a diffuser 108P is provided at the tip of an oxygen feed system 108E. The diffuser 108P is extended in the oxidizing chamber 108, and has a plurality of oxygen exhaust nozzles 108Q. According to this example, oxygen can uniformly diffuse by providing the diffuser 108P even the pipe for feeding oxygen to the oxidizing chamber 108 is a single pipe. Such a diffuser may be provided at the tip of each of the plurality of feed systems shown in FIG. 10 or 11.

In place of the diffuser which is extended in the oxidizing chamber by about half circle as shown in FIG. 12, a diffuser substantially surrounding the whole periphery of the oxidizing chamber may be provided.

Fifth Embodiment

As the fifth embodiment of the present invention, the features of an NOL obtained by a fabricating method according to the present invention will be described below. That is, in this embodiment, the features of NOL-SPSV films obtained by the above described fabricating methods in the first through third embodiments will be described in detail.

First, with respect to performance of a sheet film Rs, characteristics were considerably improved according to an aspect of the present invention so that a sheet conductance variation $\Delta Gs=7.6$ m$\Omega^{-1}$, a rate of change in MR=15.6%, a sheet resistance Rs=15.6$\Omega$ and $H_{ua}^{flat}$=500 e. Specifically, the present invention first succeeded in coping with both the considerable improvement of $\Delta Gs$ meaning the potential of the GMR effect and a good magnetic coupling of upper and lower pinned layers arranged via an NOL. This will be described below in detail.

Figure 13:
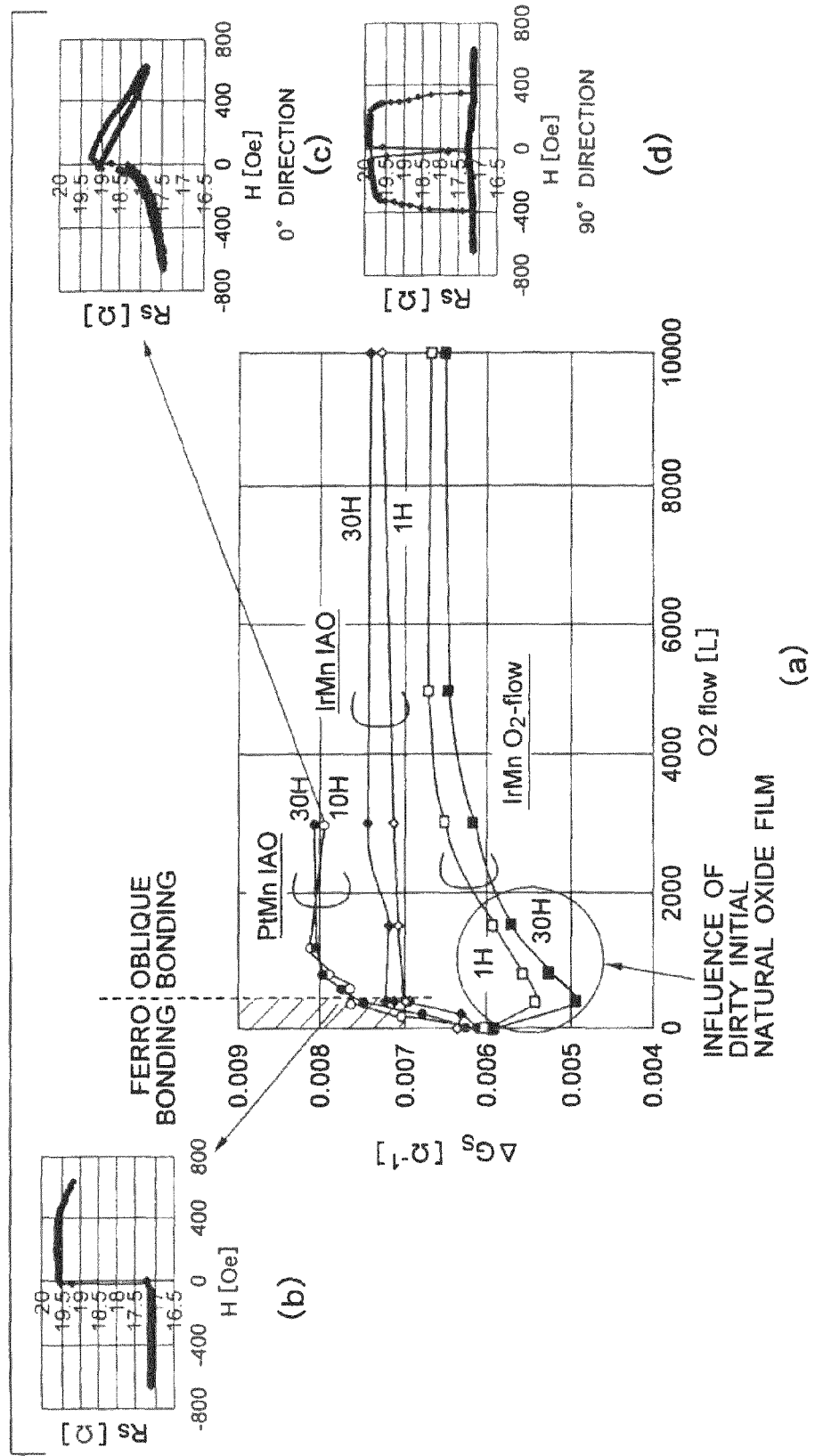
FIG. 13 is a graph showing the relationship between the amount of oxygen introduced into an oxidizing chamber and the obtained ΔGs of NOL-SPSV, and evaluation results of a sheet resistance Rs, in the fifth embodiment of the present invention.

FIG. 13($a$) is a graph showing the relationship between the amount of oxygen fed to an oxidizing chamber and $\Delta Gs$ of an obtained NOL-SPSV. In this figure, the axis of abscissas shows the amount of fed oxygen by Langmuir (L), and the axis of ordinates shows the sheet conductance variation $\Delta Gs$ of an obtained NOL-SPSV film. It is herein defined that the sheet conductance variation $\Delta Gs = Gs_{max} - Gs_{min}$ wherein $Gs_{max}$ denotes a sheet conductance when the magnetizing directions of a pinned layer and a free layer are parallel and $Gs_{min}$ denotes a sheet conductance when the magnetizing directions of a pinned layer and a free layer are anti-parallel. As the sheet conductance variation $\Delta Gs$ increases, the variation in MR increases.

In FIG. 13($a$), the expression "IAO" indicates one which is formed by the method according to the fifth embodiment of the present invention, and the expression "$O_2$-flow" indicates one which is formed by naturally oxidized by the conventional simple oxygen flow method. With respect to these, a heat treatment at 270° was carried out for 1 hour (1H), 10 hours (10H) or 30 hours (30H).

As can be seen from FIG. 13($a$), the simple oxygen flow method can not obtain a high $\Delta Gs$ even if the amount of fed oxygen increases. That is, it is possible to only obtain an NOL having a low specularity. In addition, $\Delta Gs$ decreases by the heat treatment, so that the simple oxygen flow method is thermally unstable. By a depth profile based on the secondary ion mass spectroscopy (SIMS), it was verified that this is caused by the fact that oxygen of the NOL was unstable and diffused into the SPSV film. Moreover, on the condition that the amount of fed oxygen is small, there is a tendency for $\Delta Gs$ to be lower than that when no oxygen is fed. It is considered that the reason for this is that a dirty oxide layer having a bad quality is formed without forming an oxidized NOL having a good quality in very small amounts of oxygen. That is, in the natural oxidation wherein no energy is supplied, the NOL formed at the initial stage of oxidation causes the deterioration of specularity.

On the other hand, if the IAO process according to the fifth embodiment of the present invention is used, it is shown that $\Delta Gs$ continuously increases without deteriorating once as the amount of oxygen increases, so that a stable, high quality oxide layer is formed even in very small amount of oxygen. It is considered that this is based on the assist effect of energy of ion beams. In the case of the conventional IBO method, the energy assist effect is caused. However, when oxygen is first fed to the oxidizing chamber, the surface of the substrate is exposed to suspended oxygen leaking out of a grid before oxygen plasma is produced while ion assist does not exist, so that the initial layer of the NOL is a dirty oxide layer having no energy assist. This is not good.

As can bee seen from FIG. 13, when the IAO process according to the fifth embodiment of the present invention is used, the heat resistance of $\Delta Gs$ is very good, and $\Delta Gs$ does not deteriorate even after a heat treatment is carried out at 270° C. for 30 hours. This is in contrast to the simple oxygen flow, and shows that the NOL according to the fifth embodiment of the present invention is thermally very stable.

FIG. 13($b$) shows sheet resistance (Rs)— magnetic field (H) characteristics obtained by applying a magnetic field in a normal magnetic field direction in a spin-valve element which is formed by the IAO in small amounts of oxygen.

FIG. 13($c$) shows Rs-H characteristics obtained by applying a magnetic field in the regular magnetic field direction in an element which is formed by the IAO in large amounts of oxygen, and FIG. 13($d$) shows Rs-H characteristics obtained by applying a magnetic field in a direction perpendicular to the regular magnetic field direction in the same element.

As can be seen from these evaluated results, when the amount of oxygen is small in the IAO, the upper and lower pinned layers arranged via the NOL are ferromagnetically pin-connected, whereas when the amount of oxygen is higher than 600 L, the pinned layers are connected in an oblique direction of about 90° which is not ferromagnetic and not antiferromagnetic. An element having such a connection can not be used for an actual head device even if a high $\Delta Gs$ is obtained.

Figure 14:
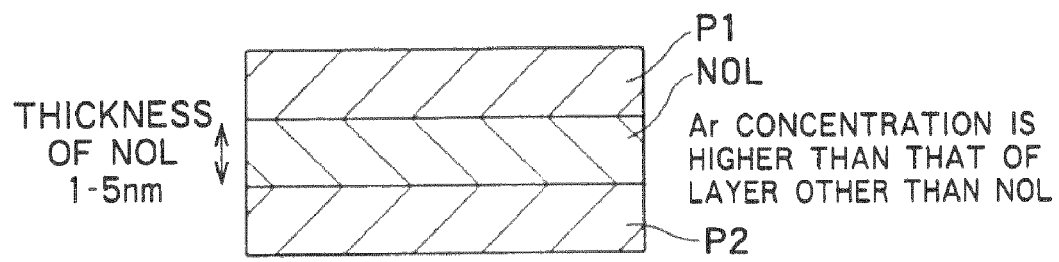
FIG. 14 is a conceptual drawing showing features of an NOL for obtaining a good performance according to the present invention.
Figure 15:
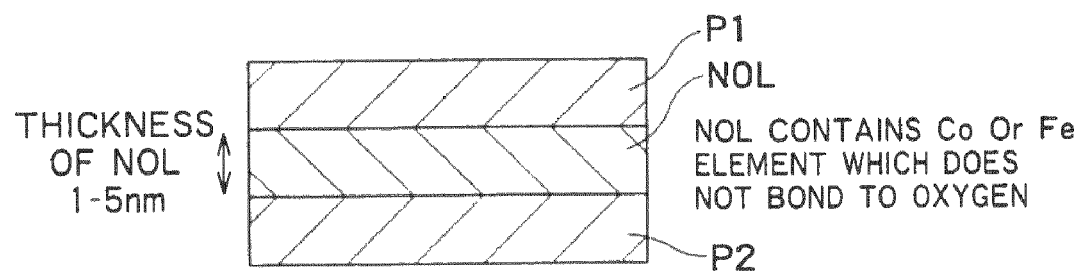
FIG. 15 is a conceptual drawing showing features of an NOL for obtaining a good performance according to the present invention.

FIGS. 14 and 15 are conceptual drawings showing features of an NOL for obtaining the above described good performance. First, in the case of a small amount of oxygen such as 400 L oxygen, the thickness of the NOL was calculated to be about 1.5 nm by the transmission electron microscopy (TEM) analysis.

According to the fifth embodiment of the present invention, the energy effect based on argon ion irradiation is utilized, so that the NOL contains a larger amount of argon than that contained in the upper and lower pinned layers P1 and P2 which are deposited by the sputtering method. Specifically, the atomic composition of argon contained in the NOL is twice or more as much as the atomic composition of argon contained in the upper and lower pinned layers P1 and P2. For example, assuming that the content of argon contained in the pinned layers is 1 at %, the NOL contains 2 at % or more argon.

According to the results of the inventor's trial evaluations, there were some cases where the content of argon contained in the NOL reaches a few at %. That is, as compared with the pinned layers formed by the sputtering method or the like, a very large amount argon was contained. This was a common feature regardless of the amount of oxygen if the process according to the fifth embodiment of the present invention was used. This can measure the distribution of the amount of the rare gas by the energy dispersive X-ray spectroscopy (EDX) analysis of the cross-section TEM or the like.

A unique feature in small amounts of oxygen is that many metallic elements do not bond to oxygen. In particular, Co, Fe and Ni exist in a state that these elements do not bond to oxygen. This was verified by the extended X-ray absorption fine structure (EXAFS) analysis. In particular, Fe was in an oxidized state, whereas half or more of Co in $Fe_{50}CO_5$, deposited for the NOL existed in a metallic state. This was also verified by the XPS analysis using a model sample. If the NOL contains magnetic Co element which is not in an oxidized state, it is possible to obtain the strong magnetic coupling of the upper and lower pinned layers via the NOL. If the base metal of the NOL is a FeCo containing compound, Co remains in a non-oxidized state. However, even if the base metal of the NOL is another material, if any one of Co, Fe and Ni elements exists in the NOL in a state that it does not bond to oxygen, the magnetic coupling of the upper and lower pinned layers via the NOL can be held so as to be good.

However, if the base metal of the NOL contains Co, Co most easily remains in a state that it does not bond to oxygen.

In the IAO process according to embodiments of the present invention, oxygen ions are not struck, and rare gas ion irradiation is carried out. Therefore, when oxidation is carried out while energy is applied during the supply of oxygen, excessive suspended oxygen having a bad influence during the heat treatment or the like is not only desorbed, but a reductive reaction is also caused. That is, in the case of Co which is difficult to be oxidized, even if oxidation is carried out, reduction is caused by the rare gas ion irradiation, so that the probability that Co exists in a metallic state increases. This is an important point of an aspect of the present invention, and is easily realized by a process according to embodiments of the present invention, which causes a reduction reaction simultaneously with an oxidation reaction, by the above described oxidizing process in the first through third embodiments. That is, an important part is essentially given to the magnetic coupling of the pinned layers. If the magnetic metallic element which does not bond to oxygen exists in the magnetoresistance effect improving layer (e.g., NOL), the magnetic coupling of the upper and lower pinned layers P1 and P2 via the magnetoresistance effect is stabilized.

The reason why the ferro coupling is established only in the case of a thin NOL is as follows. Although its detailed mechanism is not clear, metal Co atoms existing in the NOL are not in a complete crystalline state, or are very fine even if they are crystal grains. Therefore, in either case, the NOL itself is difficult to be ferromagnetic and is in a superparamagnetic state at the best. It is considered that when the NOL has a small thickness of about 2 nm, the interface inductive effect from the upper and lower ferromagnetic pinned layers P1 and P2 acts, and Co magnetic elements existing in the NOL also have ferromagnetic properties, so that the upper and lower pinned layers are ferromagnetically coupled. In order to obtain such an effect, the thickness of the NOL is preferably in the range of from 1 nm to 3 nm, and more preferably in the range of from 1 nm to 2 nm. Furthermore, the thickness of the NOL is the thickness of a region which is observed so as to be clearly different from the metallic portion by the contrast in the cross-section TEM analysis and which is observed so as to have a different crystal lattice interval from that of the metallic portion.

On the other hand, according to an aspect of the present invention, the stable oxide of Fe is rapidly produced in the thickness direction by the high energy process in which no suspended oxygen exists, so that the specularity, i.e., the reflection property of electrons, is improved. In the conventional natural oxidation due to the simple oxygen flow, suspended oxygen diffuses by heat treatment to be unstable, and there is a problem in the composition rapidity in the interface of the NOL unless the selection of materials is very strictly carried out, so that the specularity is smaller than that in the IAO process. That is, it is an important point of an aspect of the present invention to improve the magnetic coupling of the upper and lower pinned layers via the NOL (1) by eliminating the natural oxidation mode, improving the specularity and improving the rate of change in MR, and (2) by causing the NOL to contain Co, Fe and Ni (particularly Co) which do not bond to oxygen.

The IAO process according to an aspect of the present invention should not be limited to a case where the thickness of the NOL is in the range of from about 1 no to about 3 nm as this embodiment, but it is effective if the thickness of the NOL is in the range of from 2 nm to 5 nm. In this case, there is some possibility that the magnetic coupling of the upper and lower pinned layers via the NOL is an antiferromagnetic coupling. In this case, Ru usually used in the Sy-AF structure is not required, and the magnetic field leaking from the pinned layers similar to the Sy-AF structure can be reduced even if the construction of the film is substantially the same as the monolayer pin structure which has been described in the above described embodiments, so that it can be used for a head as it is. This is also advantageous from the standpoint of the rate of change in MR, since it is possible to reduce a portion which is to be a shunt layer. Also in this case, the material of the NOL preferably includes Fe or FeCo as a base metal.

As described above, according to the fifth embodiment of the present invention, it is possible to inhibit natural oxidation due to suspended oxygen while applying high energy to the surface of the film by rare gas ions or the like during an oxidation reaction, so that it is possible to form a high quality magnetoresistance effect improving layer in very small amounts of oxygen.

Sixth Embodiment

Figure 18:
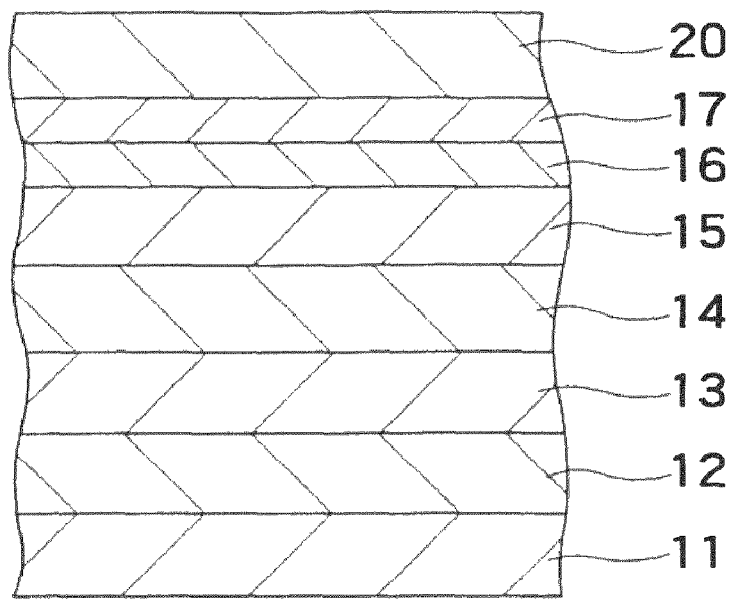
FIG. 18 is a conceptual drawing showing the construction of a cross section of a principal part of the sixth embodiment of a magnetoresistance effect element according to the present invention.

FIG. 18 is a conceptual drawing showing the construction of a cross section of a principal part of the sixth embodiment of a magnetoresistance effect element according to the present invention. That is, the magnetoresistance effect element in this embodiment comprises an underlying layer 11, an antiferromagnetic layer 12, a pinned layer 13, a non-magnetic intermediate layer 14, a free layer 15, a high conductive layer 16, an electron reflective layer 17 and a protective layer 20 which are stacked on a substrate (not shown) in that order.

In this embodiment, the electron reflective layer 17 provided on the side of the free layer 15 is formed of a substantially crystalline layer, not an amorphous layer. The crystalline layer means that the electron reflective layer 17 is formed of a single crystal or a polycrystal, e.g., that the electron reflective layer 17 is not a mixed layer in which fine crystal grains are sprinkled in amorphous.

If the electron reflective layer 17 provided outside of the free layer 15 is thus formed of the crystalline layer, it is possible to improve electron reflective characteristics and to thermally stabilize the layer. That is, if the electron reflective layer 17 is the crystalline monolayer, it is possible to form a rapid change of electron potential on the interface to the high conductive layer 16 to effectively cause electrons to reflect thereon.

In addition, if the electron reflective layer 17 is amorphous or a mixed layer of amorphous and fine crystal grains, diffusion and phase transformation are easily caused in a high temperature state, and the rapid change of the atomic composition on the interface to the high conductive layer 16 is easily lost. As a result, the rapid change of the electron potential is also lost, so that electron reflective characteristics deteriorate.

On the other hand, according to this embodiment, by forming the electron reflective layer 17 of the crystalline layer, diffusion of atoms and phase transformation hardly happen even in a high temperature state, so that the electron reflective layer 17 can be very thermally stable. As a result, high electron reflective characteristics can be maintained.

From a lattice image obtained by the transmission electron microscopy (TEM) observation, it can be determined whether it is "crystalline" or not. That is, if an orderly arrangement is observed in a lattice image, it can be determined that it is crystalline.

Alternatively, if a spot-like pattern is observed in an electron beam diffraction image, it is simultaneously single crystalline in the electron beam irradiation range, so that it can be determined that it is "crystalline". In addition, if a ring-like pattern is observed in an electron beam diffraction image, it is in a polycrystalline state in the electron beam irradiation range, so that it can be determined that it is "crystalline".

The materials of the electron reflective layer 17 include oxides containing at least one selected from B, Si, Ge, W, Nb, Mo, P, V, Sb, Zr, Ti, Zn, Pb, Zr, Cr, Al, Sn, Ga, Fe and rare-earth metals. Among these materials, non-magnetic oxides are preferred. The "non-magnetic" means "paramagnetic", "antiferromagnetic" or "diamagnetic", and means that there is no spontaneous magnetization. Among these, oxides mainly including thermally stable $SiO_2$, W—O, Nb—O, Mo—O, V—O, TiO, $Cr_2O_3$, $Fe_2O_3$ and $Al_2O_3$ are desired from the stand point of thermal stability.

It can be known whether these oxides are "non-magnetic", by measuring the magnetization of a bulk or thin-film having the same composition from the results obtained by a composition analysis using the energy dispersive X-ray spectroscopy (EDX) or the like.

As the material of the protective layer 20 provided on the electron reflective layer 17, tantalum (Ta), amorphous alumina mainly serving as an insulating layer, and so forth are stacked. These materials contain elements, such as Ta and Al which are easily oxidized, so that they are easy to absorb oxygen from the electron reflective layer 17. However, according to this embodiment, the oxide can be sufficiently stable by forming the electron reflective layer 17 of "crystalline". As a result, it is possible to inhibit oxygen from diffusing from the electron reflective layer 17 to the protective layer 20.

Methods for forming the oxide of the electron reflective layer 17 include a method for feeding oxygen into the chamber, a method for preparing the oxide by oxidation including radical oxygen, and a method for preparing the oxide by the irradiation with an ionized gas. In particular, by using a reaction gas in an active state, it is possible to form an oxide having high stability and a stable crystalline structure. At this time, the reaction gas itself may be ionized to be irradiated, or argon, xenon or neon may be ionized and irradiated while the reaction gas is introduced in the chamber.

As this time, if the influence of the reaction gas reaches the high conducive layer, the deterioration of thermal stability and the deterioration of the MR are caused, so that the reaction must be stopped on the interface to the high conductive layer. Therefore, it is better to use chemically strongly process using the reactive gas with weaker intennsity.

Alternatively, layer 17 can be prepared by sputtering. In this case, it is possible to obtain a better crystalline film by the ion beam sputtering than the RF sputtering since it is easy to control the quality of the film.

The thickness of the electron reflective layer 17 must be 0.5 nm or more in order to obtain the thermal stability and uniform quality of the film. On the other hand, if the thickness of the electron reflective layer 17 is 5 nm or more, it is difficult to insert the electron reflective layer 17 at a distance between shields corresponding to a high density recording when a magnetic head is formed. For that reason, the thickness of the electron reflective layer 17 is preferably 5 nm or less.

The thickness of the free layer 15 may be thin to some extent in order to cause the electron reflective effect to effectively contribute to the improvement of the MR. Specifically, the thickness of the free layer 15 is preferably 5 nm or less. However, if the free layer 15 is too thin, the difference between the mean free paths of up-spin electrons and down-spin electrons decreases to conspicuously decrease the MR effect, so that the thickness of the free layer 15 is preferably 1 nm or more.

The free layer 15 may be formed of a Co alloy or may have a stacked structure of a Co alloy and an Ni alloy. In order to obtain the electron reflective effect, the free layer 15 is preferably formed of a single layer of a Co alloy since electron scattering which does not contribute to the MR can be avoided if the number of the lamination interfaces is smaller.

On the other hand, the pinned layer 13 may have a structure including an electron reflective layer (not shown) or a synthetic antiferromagnetic structure. If the synthetic antiferromagnetic structure is not used, a ferromagnetic layer (not shown) may be formed below the antiferromagnetic exchange bias film 12 as a bias adjusting layer. The synthetic antiferromagnetic structure may be combined by using ruthenium (Ru), or the electron reflective layer (not shown) itself may have the antiferromagnetic coupling. This can be obtained by controlling the thickness of an oxide antiferromagnetic material or an oxide ferrimagnetic material.

Seventh Embodiment

The seventh embodiment of the invention will be described below.

Figure 19:
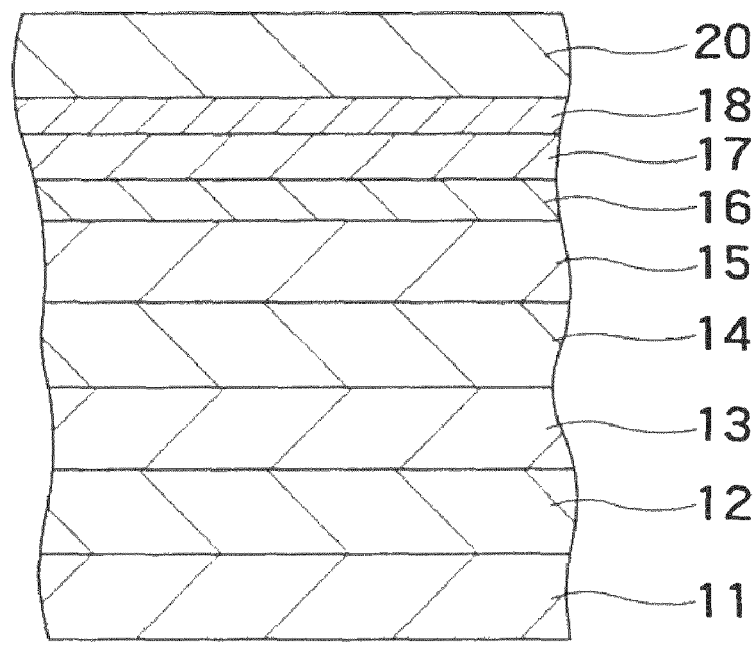
FIG. 19 is a conceptual drawing showing the construction of a cross section of a principal part of the seventh embodiment of a magnetoresistance effect element according to the present invention.

FIG. 19 is a conceptual drawing showing the construction of a cross section of a principal part of a magnetoresistance effect element in this embodiment. That is, the magnetoresistance effect element in this embodiment comprises an underlying layer 11, an antiferromagnetic layer 12, a pinned layer 13, a non-magnetic intermediate layer 14, a free layer 15, a high conductive layer 16, a first electron reflective layer 17, a second electron reflective layer 18 and a protective layer 20 which are stacked on a substrate (not shown) in that order. That is, in this construction, two or more electron reflective layers 17 and 18 are provided on the side of the free layer.

In this embodiment, it is possible to obtain a chemically stable electron reflective function by suitably selecting the materials of the two electron reflective layers. That is, by staking two or more layers of materials having different bond energies to oxygen, it is possible to suppress the diffusion of oxygen to maintain a good electron reflective interface.

Specifically, the first electron reflective layer 17 near the free layer 15 is formed of an oxide of an element which is more easily oxidized than that of the second electron reflective layer 18 far from the free layer 15. Thus, the second electron reflective layer 18 functions a barrier for inhibiting oxygen from diffusing into the protective layer 20 from the first electron reflective layer 17.

That is, the material of the protective layer 20 formed on the electron reflective layers 17 and 18 is tantalum (Ta), or amorphous alumina mainly stacked as an insulating layer. Since these materials contain elements, such as Ta and Al, which are easily oxidized, they are easy to absorb oxygen from the near electron reflective layer. On the other hand, according to this embodiment, even if the diffusion of oxygen into the protective layer 20 from the second electron reflective layer 18 near the protective layer 20, oxygen is difficult to leak out of the first electron reflective layer 17 into the second electron reflective layer 18. Because the first electron reflective layer 17 contains an element which is more easily oxidized. That is, the second electron reflective layer 18 functions as a "barrier" to the diffusion of oxygen, so that it is possible to effectively prevent oxygen from leaking out of the first electron reflective layer 17.

More specifically, the first electron reflective layer 17 is formed of an oxide of a material containing a first element selected from B, Si, Ge, Ta, W, Nb, Al, Mo, P, V, As, Sb, Zr, Ti, Zn, Pb, Th, Be, Cd, Sc, La, Y, Pr, Cr, Sn, Ga, Cu, In, Rh, Pd, Mg, Li, Ba, Ca, Sr, Mn, Fe, Co, Ni, and Rb, and the second electron reflective layer 18 is formed an oxide containing a second element selected from elements arranged on the right of the first element, which is contained in the first electron reflective layer 17, in the above described arrangement of elements.

From the left to the right in the above described arrangement of elements, the bond energy to oxygen decreases, so that the element is more difficult to be oxidized. That is, as described above, if the first electron reflective layer 17 is formed of an oxide of a more left element, the electron reflective layer 17 is more stable than the second electron reflective layer 18, so that the second electron reflective layer 18 functions as a barrier for inhibiting oxygen from diffusing.

As described above, the protective layer 20 is formed of Ta or amorphous alumina. However, amorphous alumina may be stacked via Ta or the like since oxygen is greatly absorbed if amorphous alumina is formed directly on the electron reflective layer 18.

If the first electron reflective layer 17 nearest to the high conductive layer 16 is crystalline as the first embodiment, it is possible to obtain better electron reflective characteristics. However, if the first electron reflective layer 17 has the construction for preventing the diffusion of oxygen as this embodiment, it is possible to stably obtain good characteristics to some extent even if it is amorphous.

If the combination of the main components of the first electron reflective layer 17 and the second electron reflective layer 18 outside thereof is a combination of a Ta oxide in the former and an Ni oxide in the latter, a combination of a Ta oxide in the former and an Al oxide in the latter, a combination of a Cr oxide in the former and an Ni oxide in the latter, or a combination of an Al oxide in the former and an Ni oxide in the latter, it is possible to obtain good characteristics.

Method for forming these oxides include a method for preparing the oxide by an oxidizing process including radical oxygen, and a method for preparing the oxide by the irradiation of a gas containing ionized oxygen. Alternatively, the oxide can be prepared by sputtering. In this case, it is possible to obtain a better crystalline film by the ion beam sputtering than the RF sputtering since it is easy to control the quality of the film.

The thickness of the electron reflective layers 17 and 18 is preferably 0.5 nm or more in order to obtain the thermal stability and uniform quality of the film. On the other hand, if the thickness is 5 nm or more, it is difficult to insert the electron reflective layers at a distance between shields corresponding to a high density recording when a magnetic head is formed. For that reason, the thickness is preferably 5 nm or less.

The thickness of the free layer 15 may be thin to some extent in order to cause the electron reflective effect to effectively contribute to the improvement of the MR. Specifically, the thickness of the free layer 15 is preferably 5 nm or less. However, if the free layer 15 is too thin, the difference between the mean free paths of up-spin electrons and down-spin electrons decreases to conspicuously decrease the MR effect, so that the thickness of the free layer 15 is preferably 1 nm or more.

The free layer 15 may be a Co alloy or may have a stacked structure of a Co alloy and an Ni alloy. In order to obtain the electron reflective effect, the free layer 15 is preferably formed of a single layer of a Co alloy since electron scattering which does not contribute to the MR can be avoided if the number of the lamination interfaces is smaller.

On the other hand, the pinned layer 13 may have a structure having an electron reflective layer (not shown), or simultaneously, may have a synthetic antiferromagnetic structure. If the synthetic antiferromagnetic structure is not used, a ferromagnetic layer (not shown) may be formed as a bias adjusting layer below the antiferromagnetic layer 12 serving as an antiferromagnetic exchange bias film. The synthetic antiferromagnetic structure may be combined by using ruthenium (Ru), or the electron reflective layer (not shown) itself may bear the antiferromagnetic coupling. This can be obtained by controlling the thickness of an oxide antiferromagnetic material or an oxide ferrimagnetic material.

While the electron reflective layer has had a two-layer construction in the above described example, the present invention should not be limited thereto, but the electron reflective layer may have a multi-layer construction having three or more electron reflective layers.

Figure 20:
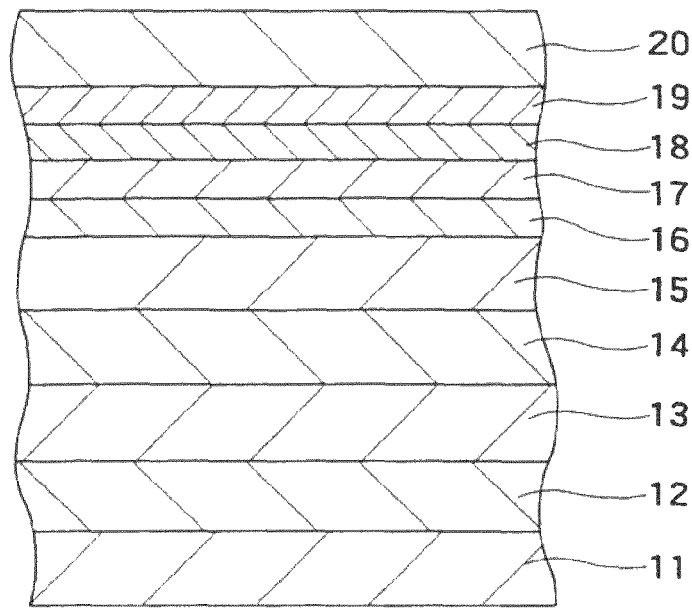
FIG. 20 is a conceptual drawing showing an example of a construction wherein an electron reflective layer comprises three layers in the seventh embodiment of the present invention.

FIG. 20 is a conceptual drawing showing an example of a construction wherein an electron reflective layer comprises three layers. That is, in a spin-valve element in this figure, a first electron reflective layer 17, a second electron reflective layer 18 and a third electron reflective layer 19 are stacked on a high conductive layer 16 in that order. The relationship between the first electron reflective layer 17 and the second electron reflective layer 18 is the same as that described above with respect to FIG. 2. That is, the first electron reflective layer 17 is formed of an oxide of an element which is more easily oxidized.

On the other hand, the third electron reflective layer 19 may be formed of an oxide of an element which is more easily oxidized than the second electron reflective layer 18. Inversely, the third electron reflective layer 19 may be formed of an oxide of an element which is more difficult to be oxidized than the second electron reflective layer 18.

If the third electron reflective layer 19 is formed of an element which is easily oxidized, the third electron reflective layer 19 itself is an stable oxide, so that it is possible to inhibit oxygen from leaking out of the third electron reflective layer 19 into the protective layer 20. As a result, the third electron reflective layer 19 can functions as a diffusion barrier to oxygen with respect to the underlying first and second electron reflective layers 17 and 18.

On the other hand, if the third electron reflective layer 19 is formed of an element which is difficult to be oxidized, oxygen easily leaks out of this electron reflective layer 19 into the protective layer 20. However, since the first and second electron reflective layers 17 and 18 contain more easily oxidized elements similar to the above described mechanism with respect to FIG. 19, oxygen is difficult to leak out of the first and second electron reflective layers 17 and 18 into the third electron reflective layer 19. That is, the third electron reflective layer 19 can function as a diffusion barrier to oxygen with respect to the first and second electron reflective layers 17 and 18.

While the electron reflective layer having the three-layer construction has been illustrated in FIG. 20, the present invention may be applied to multi-layer structures including four or more electron reflective layers. In all cases, the above described relationship referring to FIG. 19 may be maintained between the electron reflective layer nearest to the free layer 15 and the electron reflective layer adjacent thereto.

As described above, according to this embodiment, the electron reflective layer on the free layer has the multi-layer structure, and the electron reflective layer nearest to the free layer is formed of the oxide of the element which is more easily oxidized than the electron reflective layer adjacent thereto, so that it is possible to realize stable electron reflective characteristics.

Eighth Embodiment

Figure 21:
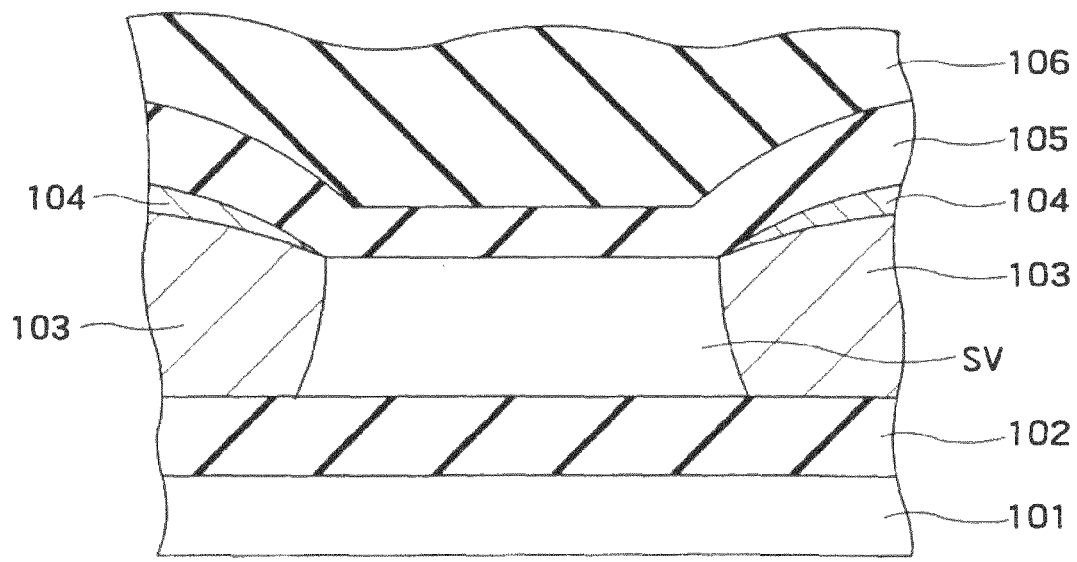
FIG. 21 is a conceptual drawing showing the construction of a cross section of a principal part of the eighth embodiment of a magnetic head according to the present invention.

FIG. 21 is a conceptual drawing showing the construction of a cross section of a principal part of a magnetic head according to the eighth embodiment of the present invention. That is, an alumina gap layer 102 is formed on a substrate 101, and a magnetoresistance effect element SV according to the eighth embodiment of the present invention is selectively provided thereon. The magnetoresistance effect element SV is any one of the above described elements in the sixth and seventh embodiments. On both ends of the magnetoresistance effect element SV, a pair of bias layers 103, 103 for biasing the magnetization of a free layer are provided. The bias layer 103 is formed of a ferromagnetic material or an antiferromagnetic material.

Moreover, on both ends of the magnetoresistance effect element SV, a pair of electrodes 104, 104 for supplying a sense current are provided, and an alumina gap layer 105 and a head protective layer 106 are formed thereon.

The distance between shields may be in the range of from about 50 nm to about 100 nm, and the track width may be in the range of from about 0.15 microns to about 0.3 microns.

Example 1

Examples of the eighth embodiment of the present invention will be described below.

An SV film having the following construction was prepared by the sputtering method, and MR characteristics were compared.

Ta 3 nm (Underlying Layer)/NiFeCr 3 nm (Underlying Layer/PtMn 10 nm (Antiferromagnetic Layer)/CoFe 1.5 nm (Pinned layer)/Ru 0.9 nm (Pinned layer)/CoFe 0.5 nm (Pinned layer)/Fe Oxide 1.5 nm (Electron Reflective Layer)/CoFe 2 nm (Pinned layer)/Cu 2 nm (Non-magnetic Intermediate Layer)/CoFe 2 nm (Free Layer)/Cu 1 nm (High Conductive Layer)/X (Electron Reflective Layer)/Amorphous Alumina 100 nm In this SV film, an oxidizing process was carried out by various oxidizing methods to form an Fe oxide or Cr oxide having a thickness of 1 nm as the electron reflective layer X to observe the kind and abundance ratio of the product by the extended X-ray absorption fine structure (EXAFS) and crystalline properties by the cross-section TEM. The results thereof are shown below.

| Sample | X (Thickness 1 nm) | Oxidizing Method | Composition (After Heat Treatment in Vacuum at 270° C. for 10 Hors) |
|---|---|---|---|
| Ex. 1 | Fe Oxide | Oxygen Ion Irradiation 30 Seconds | $FeO:Fe_2O_3:Fe_3O_4 = 0.5:8.5:1.5$ |
| Ex. 2 | Fe Oxide | Oxygen Radical Irradiation 30 Seconds | $FeO:Fe_2O_3:Fe_3O_4 = 0.5:8.5:1.5$ |
| Ex. 3 | Fe Oxide | Ion Beam Sputter of $Fe_2O_3$ | $FeO:Fe_2O_3:Fe_3O_4 = 0.5:8.5:1.5$ |
| Ex. 4 | Cr Oxide | Oxygen Ion Irradiation 30 Seconds | $Cr:Cr_2O_3 = 0:10$ |
| Ex. 5 | Cr Oxide | Oxygen Radical Irradiation | $Cr:Cr_2O_3 = 0:10$ |
| Comp. Ex. 1 | Fe Oxide | 30 Seconds Natural Oxidation | $FeO:Fe_2O_3:Fe_3O_4 = 5:1:4$ |
| Comp. Ex. 2 | Fe Oxide | Oxygen Ion Irradiation 15 Seconds | $FeO:Fe_2O_3:Fe_3O_4 = 0.5:1.5:8.5$ |
| Comp. Ex. 3 | Cr Oxide | Natural Oxidation | $Cr:Cr_2O_3 = 0.5:9.5$ |

In Examples 1, 2 and Comparative Examples 1, 2, after metal Fe was formed so as to have a thickness of 1 nm, an oxidizing process was carried to form an Fe oxide of the electron reflective layer X.

In the case of the natural oxidation, the oxidizing process was carried out in an atmosphere of an order of $10^{-6}$ Torr. In the case of the ion irradiation, argon (Ar) and oxygen ($O_2$) were fed in flow rates of 1 sccm and 5 sccm, respectively, to produce the plasma thereof, and the accelerating voltage was 50 eV.

In the oxygen radical irradiation, Ar and $O_2$ were fed in flow rates of 1 sccm and 5 sccm, respectively, to produce the plasma thereof to be fed by a differential pressure from an irradiation port spaced from the substrate by 10 to 15 cm.

In the ion beam sputtering, a target of $Fe_2O_3$ was sputtered with Ar. In addition, oxygen of 1 sccm was mixed with Ar.

The results of evaluated MR characteristics of these samples are shown below.

| Sample | After Annealing at 270° C. for 10 Hours | After 30 Hours at 270° C. |
|---|---|---|
| Ex. 1 | 16% | 16.1% |
| Ex. 2 | 15.8% | 16% |
| Ex. 3 | 15.7% | 16% |
| Ex. 4 | 16.5% | 16.5% |
| Ex. 5 | 16.3% | 16.4% |
| Comp. Ex. 1 | 12% | 10% |
| Comp. Ex. 2 | 15% | 14% |
| Comp. Ex. 3 | 13.5% | 14% |

It was only 12% in Comparative Example 1, whereas it was a great value of 15% or more in Comparative Example 2 and Examples 1 through 3. It is considered that the reason for this is that good electron reflection can not be obtained by the variation in electron potential since various phases of Fe oxides are mixed in Comparative Example 1. Also by the cross-section TEM, amorphous forms appear at every place in Comparative Example, and it was observed in Comparative Example 2 and Examples 1 through 3 that the oxidized layer itself was epitaxial-grown. Thus, it was found that the oxide formed a clear crystal lattice by carrying out the oxidizing process applying energy. It was also found that the MR was improved by this.

On the other hand, after it was attempted to measure magnetization in Comparative Example 2, a clear difference in spontaneous magnetization was observed in comparison with Examples, and the difference was 5% in the whole magnetization. From this, it was found that the bias point was shifted. Because a large amount of $Fe_3O_4$ serving as a ferrimagnetic component is included.

On the other hand, as a result of the measurement of magnetization in Examples, it was not found that the magnetization was significantly different from that when no Fe oxide was formed. For that reason, it was possible to adjust the bias point in accordance with the design of the thickness of the film. Additionally, material of $Cr_2O_3$ is anti-ferromagnetic. Also in this case, in the case of natural oxidation, it was found that a state mixed with a metallic phase was formed and that a crystal lattice image included a large amount of amorphous components, so that the electron reflective effect was slightly inhibited.

On the other hand, in the oxygen radical irradiation and ion irradiation, it was found that a good crystalline film was formed even in the cross-section TEM. It was also possible to obtain good MR characteristics. In addition, all of corundum oxides of an alloy selected from Co, Fe, Ni and Cr had good MR characteristics. If 5% or less of Si, Mg, Al or B was added to these corundum obtains, good MR characteristics and thermal stability were obtained.

Then, the following structures were prepared as the construction of X.

| Sample | Construction |
|--------|--------------|
| Ex. 6 | Ta Oxide 2 nm/NiO 2 nm/Ta 3 nm |
| Ex. 7 | Ta Oxide 2 nm/$Al_2O_3$ 2 nm/Ta 3 nm |
| Ex. 8 | Ta Oxide 2 nm/NiO 2 nm |
| Ex. 9 | Ta Oxide 2 nm/$Al_2O_3$ 2 nm |
| Comp. Ex. 4 | Ta Oxide 2 nm/Ta 3 nm |
| Comp. Ex. 5 | Ta Oxide 2 nm |
| Comp. Ex. 6 | NiO 2 nm/Ta Oxide 2 nm/Ta 3 nm |
| Comp. Ex. 7 | $Al_2O_3$ 2 nm/Ta Oxide 2 nm/Ta 3 nm |
| Comp. Ex. 8 | NiO 2 nm/Ta Oxide 2 nm |
| Comp. Ex. 9 | $Al_2O_3$ 2 nm/Ta Oxide 2 nm |

All of the above described oxide layers were prepared by forming metal layers and oxidizing the formed metal layers by ion beam irradiation. The results of the MR measurement of these oxide layers are shown below.

| Sample | After Annealing at 270° C. for 10 Hours | After 30 Hours at 270° C. |
|--------|------------------------------------------|----------------------------|
| Ex. 6 | 15% | 14.9% |
| Ex. 7 | 15.1% | 14.9% |
| Ex. 8 | 15.3% | 15.3% |
| Ex. 9 | 15.3% | 15.2% |
| Comp. Ex. 4 | 11% | 9.8% |
| Comp. Ex. 5 | 14.2% | 11.9% |
| Comp. Ex. 6 | 11.1% | 10% |
| Comp. Ex. 7 | 14.3% | 13% |
| Comp. Ex. 8 | 11.4% | 10.1% |
| Comp. Ex. 9 | 14.8% | 13.5% |

In Comparative Example 4, after both of two kinds of annealing processes the MR decreases by 4 to 5% in comparison with Examples. Because an oxygen deficiency portion or metal Ta is segregated on the interface to the Cu layer (high conductive layer) since oxygen in the Ta oxide layer is easy to diffuse into the protective layer Ta which is made of the same kind of metal.

By the EDX observation, it was revealed that the amount of oxygen in the interface greatly decreases after the annealing. On the other hand, in Examples 6 and 7, the MR is about 15%, and thermal stability is greatly improved. Because NiO, $Al_2O_3$ and so forth function as oxygen diffusion barriers. By the EDX observation, it was found that oxygen in the interface is not changed before and after the annealing.

In Comparative Example 5, the layer X is made of amorphous Ta oxide, so that good characteristics are obtained by the annealing for a short period of time. However, with respect to thermal stability for a long period of time, electron potential in the interface to the Ta oxide changes to deteriorate characteristics since oxygen travels from and into amorphous alumina due to amorphous.

In Comparative Examples 6 and 8, it was not possible to obtain good electron reflective characteristics since NiO was formed in the interface. It was difficult to obtain a good quality of NiO film having a thickness of about 2 to 5 nm. Also in these examples, it was verified that islands of NiO were grown in the interface to Cu.

In Comparative Examples 7 and 9, good characteristics were obtained by the annealing for a short period of time, and the characteristics were maintained to some extent even after the annealing for a long period of time. However, the characteristics were slightly inferior to those in Examples 7 and 9. It is considered that the reason for this is that the diffusion of oxygen is inhibited as a whole even in Comparative Examples 7 and 9 by stacking the oxide layers, whereas the bond energy of Ta to oxygen is greater than that of Al, so that oxygen is slightly sucked into the Ta oxide to change the interface state.

In all of these Comparative Examples, it was found that metallic atoms diffused between the oxide layers, or between the oxide layer and the protective layer, or between the oxide layer and the amorphous alumina layer, by the annealing at 270° C. for 50 hours. On the other hand, in all of Examples, it was found that characteristics were not greatly changed after the same annealing and there was no problem if the proportion of the diffusing metallic atoms was about 2 to 3%.

If 5% or less of Si, Mg, Al or B is added to any one these oxides, a good heat resistance was obtained. Particularly in the oxide contacting the Cu layer, it was found by the EDX analysis that the diffusion of oxygen into the oxide layer staked outside thereof was further inhibited.

As described above, it was revealed that the structure of stacked layers having different bond energies to oxygen efficiently inhibited the diffusion of oxygen.

Referring to Examples, the magnetoresistance effect element and magnetic head according to the present invention have been described above.

Ninth Embodiment

As the ninth embodiment of the present invention, a magnetic reading system according to the present invention will be described below. The magnetoresistance effect elements according to embodiments of the present invention described referring to FIGS. 1 through 21 can be incorporated in, e.g., a recording/reproducing integral magnetic head assembly, to be mounted in a magnetic reading system.

Figure 22:
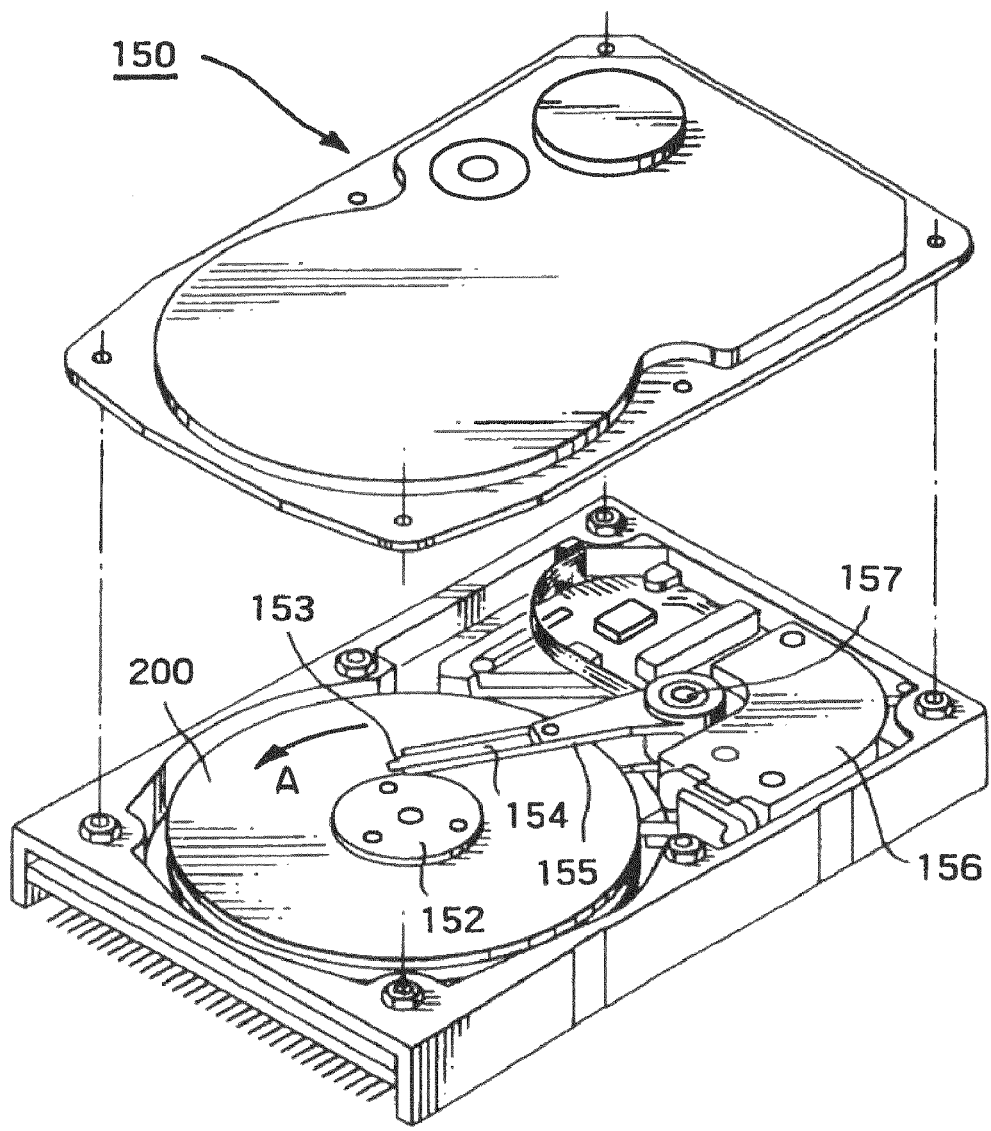
FIG. 22 is a perspective view of a principal part showing an example of a schematic construction of the ninth embodiment of a magnetic recording system according to the present invention.

FIG. 22 is a perspective view of a principal part showing an example of a schematic construction of such a magnetic recording system. That is, a magnetic recording and/or reading system 150 according to ninth embodiment of the present invention is a system of a type in which a rotary actuator is used. In this figure, a longitudinal recording or vertical recording magnetic disk 200 is mounted on a spindle 152, and is rotated in a direction of arrow A by means of a motor (not shown) which is driven in response to a control signal from a drive unit control part (not shown). The magnetic disk 200 has a longitudinal recording or vertical recording layer. A head slider 153 for recording/reading information in the magnetic disk 200 is mounted on the tip of a thin-film-like suspension 154. The head slider 153 has a magnetic head, which uses a magnetoresistance effect element in any one of the above described embodiment, in the vicinity of the tip thereof.

If the magnetic disk 200 rotates, the medium facing surface (ABS) of the head slider 153 is held so as to be spaced from the surface of the magnetic disk 200 by a predetermined flying height.

The suspension 154 is connected to one end of an actuator arm 155 which has a bobbin portion for holding a driving coil (not shown). On the other end of the actuator arm 155, there is provided a voice coil motor 156 which is a kind of linear motor. The voice coil motor 156 comprises a driving coil (not shown) wound onto the bobbin portion of the actuator arm 155, and a magnetic circuit comprising a permanent magnet and a facing yoke which face each other so as to sandwich the coil therebetween.

The actuator arm 155 is held by ball bearings (not shown) which are provided at two places above and below a fixed axis 157, and is rotatable and slidable by the voice coil motor 156.

Figure 23:
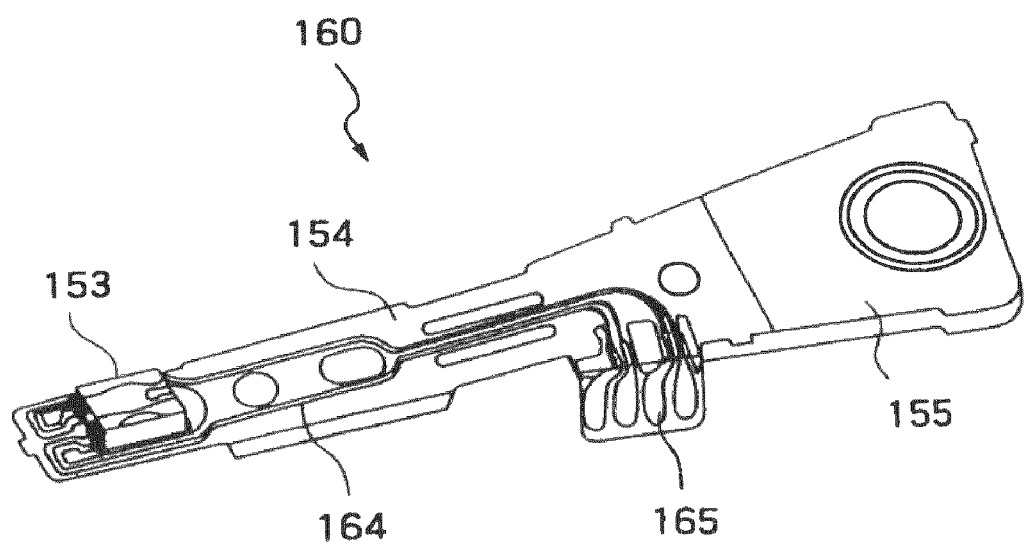
FIG. 23 is an enlarged perspective view of a magnetic head assembly in front of an actuator arm 155 viewed from the side of a disk.

FIG. 23 is an enlarged perspective view of a magnetic head assembly in front of the actuator arm 155 viewed from the side of a disk. That is, a magnetic head assembly 160 has an actuator arm 151 having, e.g., a bobbin portion for holding a driving coil, and a suspension 154 is connected to one end of the actuator arm 155.

On the tip of the suspension 154, a head slider 153 having a reading magnetic head using any one of the above described magnetoresistance effect elements referring to FIGS. 1 through 21 is mounted. A recording head may be combined therewith. The suspension 154 has a lead wire 164 for writing/reading signals. This lead wire 164 is electrically connected to the respective electrodes of the magnetic head incorporated in the head slider 153. In the figure, reference number 165 denotes an electrode pad of the magnetic head assembly 160.

Between the medium facing surface (ABS) of the head slider 153 and the surface of the magnetic disk 200, a predetermined flying height is set.

Figure 24:
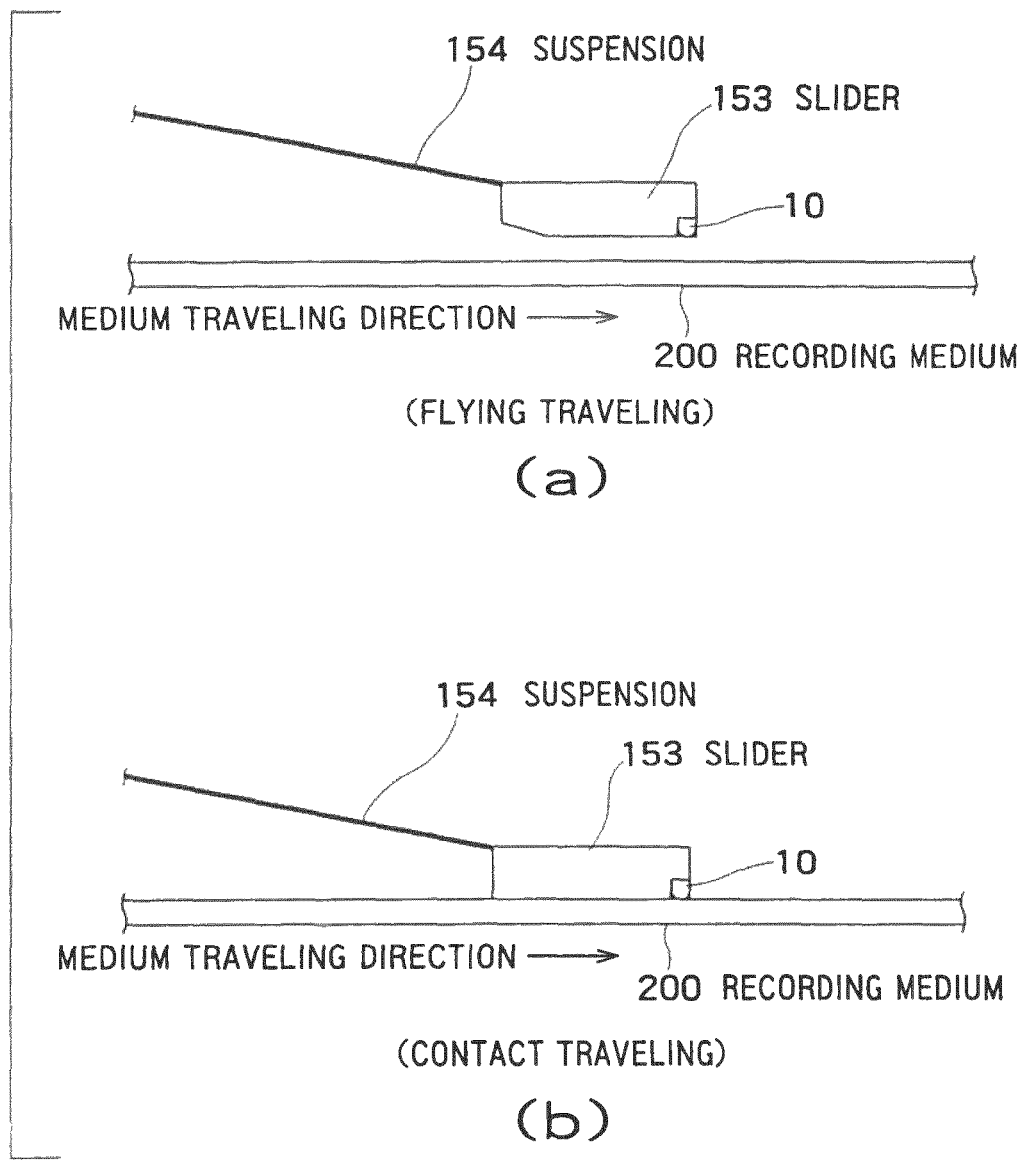
FIG. 24(a) is a conceptual drawing showing the relationship between a head slider 153 and a magnetic disk 200 when a flying height is a predetermined positive value.
FIG. 24(b) is a conceptual drawing showing the relationship between such a "contact traveling type" head slider 153 and the magnetic disk 200.

FIG. 24(a) is a conceptual drawing showing the relationship between the head slider 153 and the magnetic disk 200 when the flying height is a predetermined positive value. As illustrated in this figure, in usual many magnetic recording systems, the slider 153 including the magnetic head 10 operates while flying at a predetermined height from the surface of the magnetic disk 200. According to the ninth embodiment of the present invention, such a "flying traveling type" magnetic recording system can also read at low noises with a higher resolution than conventional systems. That is, by adopting any one of the above described magnetoresistance effect elements referring to FIGS. 1 through 21, weak magnetization information from a track to be read can be surely read. That is, since it is possible to reproduce a signal from a fine magnetic domain recorded at a high density, it is possible to reduce the track pitch to greatly improve the recording density.

On the other hand, if the recording density further increases, it is required to lower the flying height to glide the slider nearer to the magnetic disk 200 to read information. For example, in order to obtain a recording density of about 40 G (giga) bits per one square inch, the spacing loss due to the flying of the slider is too large, so that it is not possible to ignore the problem of the collision of the head 10 with the magnetic disk 200 due to the very low flying.

For that reason, a system for traveling the slider while positively causing the magnetic head 10 to contact the magnetic disk 200 is also considered.

FIG. 24(b) is a conceptual drawing showing the relationship between such a "contact traveling type" head slider 153 and the magnetic disk 200. The magnetic head according to the present invention can also be mounted on the "contact traveling type" slider by providing a diamond-like carbon (DLC) lubricating film on the contact surface to the medium. Therefore, the "contact traveling type" magnetic reading system illustrated in FIG. 24(b) can also greatly reduce crosstalk from adjacent tracks to greatly reduce the track pitch in comparison with conventional systems to stably carry out a recording/reading operation in a medium having a higher density.

As described above, according to the present invention, the crystalline oxide is used as the electron reflective layer on the side of the free layer, so that it is possible to obtain good electron reflective characteristics, good thermal stability and reliability.

In addition, according to the present invention, the electron reflective layer on the side of the free layer has the stacked structure of two or more layers, so that it is possible to further inhibit the diffusion of oxygen.

As a result, it is possible to realize a magnetic recording/reading technique at a recording density of 50 Gbpsi or more, so that there is a great industrial merit.

For example, the substrate, buffer layer, antiferromagnetic layer, pinned layer, non-magnetic spacer layer, free layer, high conductive layer, specular layer and protective layer of the magnetoresistance effect element should not be limited to those described in the respective examples, and the present invention can include all embodiments, which can be selected by persons with ordinary skill, to provide the same effects.

The magnetic reading system may be a reading only system or a recording and/or reading system. In addition, the medium should not be limited to a hard disk, but it may be any one of all magnetic recording media, such as flexible disks and magnetic cards. Moreover, the magnetic reading system may be a so-called "removable" type system wherein a magnetic recording medium is removed from the system.

As described above, according to the present invention, it is possible to realize a magnetoresistance effect element having high sensitivity and high reliability.

Additional advantages and modifications will readily occur to those skilled in the art. Therefore, the invention in its broader aspect is not limited to the specific details and representative embodiments shown and described herein. Accordingly, various modifications may be made without departing from the spirit or scope of the general inventive concept as defined by the appended claims and their equivalents.

What is claimed is:

1. A magnetoresistance effect element comprising:
   two ferromagnetic layers, one of the two ferromagnetic layers being a magnetization fixed layer having a magnetization direction substantially fixed to one direction, and the other ferromagnetic layer being a magnetization free layer having a magnetization direction varying in response to an external magnetic field;
   a non-magnetic layer provided between the ferromagnetic layers; and
   a layer containing an oxide as a principal component and containing a magnetic transition metal element which does not bond to oxygen and which is at least one of Co, Fe and Ni, wherein,
   the magnetoresistance effect element has a resistance varying in response to a relative angle between the magnetization direction of the magnetization fixed layer and the magnetization direction of the magnetization free layer, and
   a thickness of the layer containing the oxide as the principal component is in the range of from 1 nm to 3 nm.

2. The magnetoresistance effect element as set forth in claim 1, wherein the layer containing the oxide as the principal component contains a magnetic transition metal element of Co which does not bond to oxygen.

3. The magnetoresistance effect element as set forth in claim 1, wherein the magnetization fixed layer comprises:
a layer having a magnetization direction substantially fixed to one direction; a second magnetic layer; and
a third ferromagnetic layer antiferromagnetically coupled to the layer having the magnetization direction substantially fixed to one direction, via the second magnetic layer.

4. The magnetoresistance effect element as set forth in claim 1, wherein a current is applied in a direction parallel to the surfaces of the two ferromagnetic layers.

5. The magnetoresistance effect element as set forth in claim 1, wherein a current is applied in a direction perpendicular to the surfaces of the two ferromagnetic layers.

6. A magnetoresistance effect element comprising:
two ferromagnetic layers, one of the two ferromagnetic layers being a magnetization fixed layer having a magnetization direction substantially fixed to one direction, and the other ferromagnetic layer being a magnetization free layer having a magnetization direction varying in response to an external magnetic field;
a non-magnetic layer provided between the ferromagnetic layers; and
a layer containing an oxide as a principal component and containing a magnetic transition metal element which does not bond to oxygen and which is at least one of Co, Fe and Ni, wherein,
the magnetoresistance effect element has a resistance varying in response to a relative angle between the magnetization direction of the magnetization fixed layer and the magnetization direction of the magnetization free layer,
the magnetization fixed layer comprises a plurality of stacked layers, and the layer containing the oxide as the principal component is provided between layers constituting the magnetization fixed layer, and
the stacked layers are connected in an oblique direction of about 90°.

7. The magnetoresistance effect element as set forth in claim 6, wherein a thickness of the layer constituting the magnetization fixed layer between the non-magnetic layer and the layer containing the oxide as the principal component is in the range of from 1 nm to 3 nm.

8. The magnetoresistance effect element as set forth in claim 7 wherein the layer containing the oxide as the principal component contains a magnetic transition metal element of Co which does not bond to oxygen.

9. The magnetoresistance effect element as set forth in claim 7, wherein a current is applied in a direction parallel to the surfaces of the two ferromagnetic layers.

10. The magnetoresistance effect element as set forth in claim 7, wherein a current is applied in a direction perpendicular to the surfaces of the two ferromagnetic layers.

* * * * *